United States Patent
Gong

(10) Patent No.: US 7,508,328 B2
(45) Date of Patent: Mar. 24, 2009

(54) ENTROPY PROCESSOR FOR DECODING

(75) Inventor: Danian Gong, Fremont, CA (US)

(73) Assignee: Nemochips, Inc., Fremont, CA (US)

( * ) Notice: Subject to any disclaimer, the term of this patent is extended or adjusted under 35 U.S.C. 154(b) by 0 days.

(21) Appl. No.: 11/855,134

(22) Filed: Sep. 13, 2007

(65) Prior Publication Data

US 2008/0072016 A1    Mar. 20, 2008

Related U.S. Application Data

(60) Provisional application No. 60/825,899, filed on Sep. 15, 2006.

(51) Int. Cl.
*H03M 7/40* (2006.01)
(52) U.S. Cl. ................ 341/67; 375/240.23; 382/246
(58) Field of Classification Search ............ 341/65, 341/67; 375/240.23; 382/244–247
See application file for complete search history.

(56) References Cited

U.S. PATENT DOCUMENTS 6,934,338 B1 * 8/2005 Bublil et al. ......... 375/240.23
6,963,613 B2 * 11/2005 MacInnis et al. ....... 375/240.23
7,262,720 B2 * 8/2007 Deeley et al. ............. 341/67

OTHER PUBLICATIONS

Berekovic et al., A Multimedia RISC Core for Efficient Bitstream Pasing and VLD, Proceedings of SPIE Multimedia Hardware Architectures 1998, vol. 3311, Jan 1998, San Jose, CA, pp. 131-142.*

* cited by examiner

*Primary Examiner*—Howard Williams
(74) *Attorney, Agent, or Firm*—Greenberg Traurig, LLP

(57) ABSTRACT

A method for processing a variable length code comprising: determining a first address; decoding opcodes from the at least one table starting at a first address; in response to each of the opcodes: receiving a portion of a sequence of bits, the sequence of bits comprising a first variable length code; receiving S from the second table at the current address; flushing S bits in the sequence of bits; receiving T corresponding to one of the stages; determining a value of a set of T bits in the sequence of bits; receiving D from the second table at the current address; and computing the next address, the next address being the sum of the current address, D, and the value of the set of T bits; and retrieving the next opcode, the next opcode being retrieved from the next address; and determining the decoded syntax element.

20 Claims, 18 Drawing Sheets

| Table Address | "T" | "S" | "O" | "D" | Decoded Symbol |
|---|---|---|---|---|---|
| 0 | 2 | 0 | ADV | 1 | null |
| 1 | 1 | 1 | LD0 | 3 | "0" |
| 2 | 1 | 1 | LD0 | 3 | "0" |
| 3 | 1 | 2 | ADV | 2 | "10" |
| 4 | 1 | 2 | LD0 | 0 | "11" |
| 5 | 1 | 1 | LD0 | 2 | "100" |
| 6 | 1 | 1 | LD0 | 1 | "101" |

Table Memory 201

| VLC Code | Symbol Value |
|---|---|
| 0 | "3" |
| 11 | "0" |
| 101 | "1" |
| 100 | "2" |

Huffman Table 200

FIGURE 2

Table 300

| Showbits | Getbits | Opcode | Immediate | Address |
|---|---|---|---|---|
| 2 | 0 | ADV | 1 | 0 |
| 1 | 1 | LD0 | 3 | 1 |
| 1 | 1 | LD0 | 3 | 2 |
| 1 | 2 | ADV | 2 | 3 |
| 1 | 2 | LD0 | 0 | 4 |
| 1 | 1 | LD0 | 2 | 5 |
| 1 | 1 | LD0 | 1 | 6 |

Table 301

| Showbits | Getbits | Opcode | Immediate | Address |
|---|---|---|---|---|
| 1 | 0 | ADV | 1 | 0 |
| 1 | 1 | LD0 | 3 | 1 |
| 1 | 1 | ADV | 0 | 2 |
| 1 | 1 | ADV | 2 | 3 |
| 1 | 1 | LD0 | 0 | 4 |
| 1 | 1 | LD0 | 2 | 5 |
| 1 | 1 | LD0 | 1 | 6 |

– 1 –

ENTROPY PROCESSOR FOR DECODING

CROSS-REFERENCE TO RELATED APPLICATIONS

The present application claims priority to Provisional U.S. Patent Application Ser. No. 60/825,899, filed Sep. 15, 2006, the disclosure of which is incorporated herein by reference.

BACKGROUND

1. Field

This disclosure relates generally to the field of data processing. More particularly, the disclosure relates to a method and apparatus for performing entropy processing.

2. Description of the Related Art

A lookup table is commonly used in decoding variable length codes (VLC) such as a Huffman VLC. A parallel decoder can speed up the decoding process since parallel decoders can decode several bits in each cycle. However, since Huffman variable length codes have variable lengths, redundant nodes are stored in the lookup table to enable decoding multiple bits in each cycle. A lookup table with redundant nodes does not efficiently use memory. The lookup table for a serial decoder is more efficient in terms of memory usage since there are less redundant nodes. However, the serial decoder is slower than the parallel decoder since serial decoding decodes only one bit in each cycle.

What is needed is a method to more efficiently perform entropy processing while more efficiently using memory.

SUMMARY

A method for processing a variable length code comprising: determining a first address; decoding opcodes from the at least one table starting at a first address; in response to each of the opcodes: receiving a portion of a sequence of bits, the sequence of bits comprising a first variable length code; receiving S from the second table at the current address; flushing S bits in the sequence of bits; receiving T corresponding to one of the stages; determining a value of a set of T bits in the sequence of bits; receiving D from the second table at the current address; and computing the next address, the next address being the sum of the current address, D, and the value of the set of T bits; and retrieving the next opcode, the next opcode being retrieved from the next address; and determining the decoded syntax element.

BRIEF DESCRIPTION OF THE DRAWINGS

These and other features, aspects, and advantages of the present invention will become better understood with regard to the following description, appended claims, and accompanying drawings where:

FIG. 2 illustrates the relationship between a Huffman table and a table memory according to one embodiment.

DETAILED DESCRIPTION OF PREFERRED EMBODIMENTS

At least some embodiments of the disclosure relate to a system and method and system for entropy processing.

The following description and drawings are illustrative and are not to be construed as limiting. Numerous specific details are described to provide a thorough understanding of the disclosure. However, in certain instances, well known or conventional details are not described in order to avoid obscuring the description. References to one or an embodiment in the present disclosure can be, but not necessarily are, references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
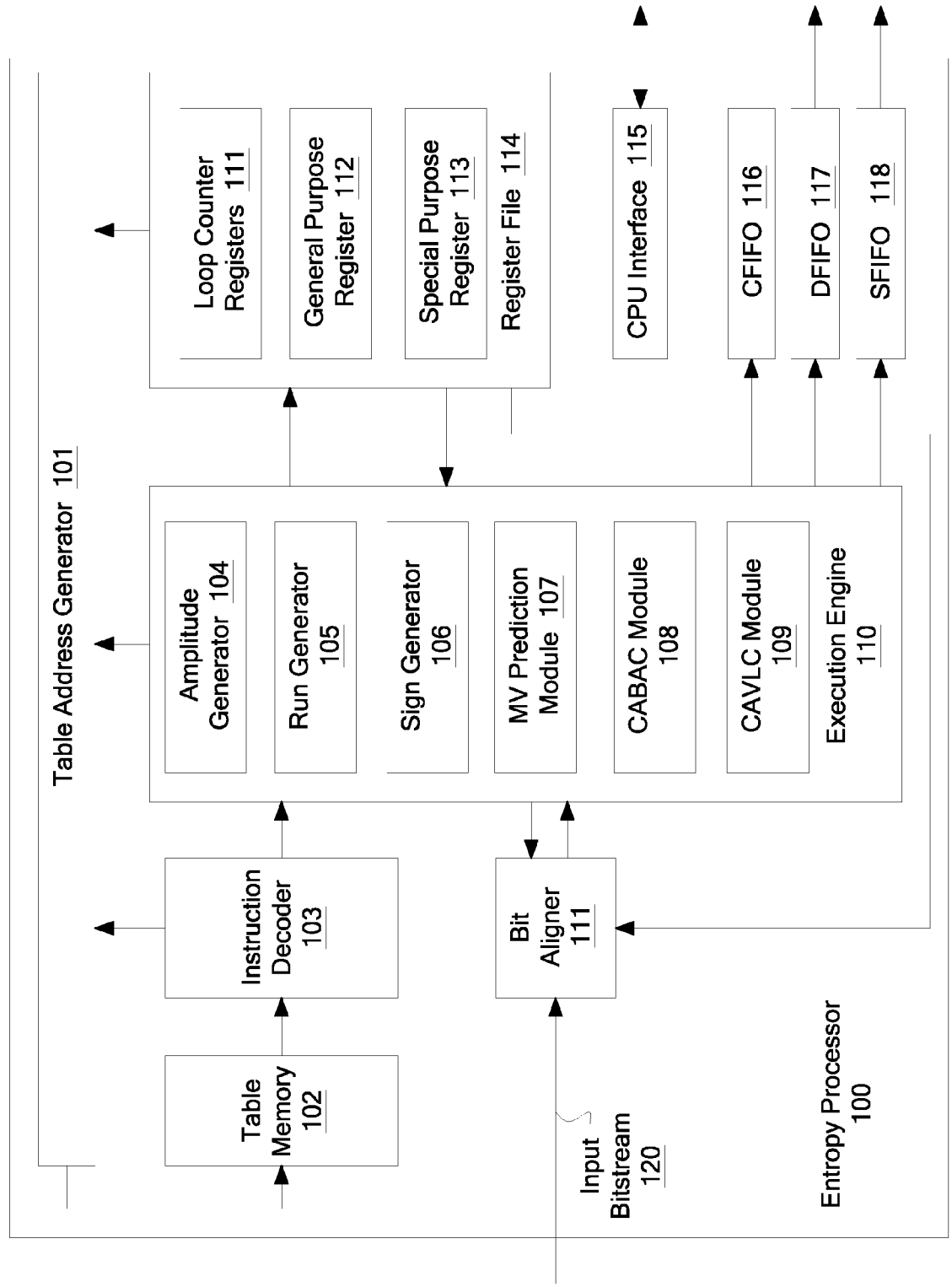
FIG. 1 illustrates one embodiment of an entropy processor of the present invention.

FIG. 1 illustrates one embodiment of an entropy processor.

An entropy processor 100 includes a bit aligner 111, an execution engine 110, a register file 114, a control FIFO (CFIFO) 116, a data FIFO (DFIFO) 117, a special FIFO (SFIFO) 118, a table address generator 101, a table memory 102, an instruction decoder 103, and a central processor unit (CPU) Interface 115. The bit aligner 111 extracts bit slices from an input bitstream 120. The input bitstream 120 comprises a sequence of bits representing a variable length code. The execution engine 110 generates decoded syntax elements from the input bitstream 120, including discrete cosine transform (DCT) coefficients such as amplitude, run and sign via an amplitude generator 104, a run generator 105, and a sign generator 106 and motion vectors via a motion vector (MV) prediction module 107, and writes the decoded syntax elements into one of the registers in the register file 114, the CFIFO 116, the DFIFO 117, or the SFIFO 118 according to the decoded instructions processed by the execution engine 110.

The table address generator 101 generates the next table address based on the outputs from execution engine 110, the register file 114 and the instruction decoder 103. The table memory 102 contains instructions, also referred to as operation codes (opcodes) and data for the execution engine 110. The next instruction for the execution engine 110 is retrieved from the table memory 102 at the address generated by the table address generator 101. The instruction decoder 103 decodes the next instruction for execution by the execution engine 110.

In one embodiment, the programmability of the entropy processor 100 is carried out by changing the contents of the table memory 102. The table memory 102 is downloaded by the CPU which is connected to the entropy processor 100 through the CPU interface 115.

In one embodiment, the instructions retrieved from the table memory 102 are decoded into multiple fields for the execution engine 110. Some of the fields, such as showbits (T) and getbits (S) fields, are provided from the execution engine 110 to the bit aligner 111 to extract the next portion of the sequence of bits to be processed. In one embodiment, a showbits field specifies the number of bits that will be obtained from the input bitstream 120 to decide the next address in the table memory 102 and a getbits field specifies the number of bits that will be flushed from the input bitstream 120. In one embodiment, the showbits and getbits fields are read out from the table memory 102 by the instruction decoder 103 and sent to execution engine 110. The showbits and getbits fields are sent to the bit aligner 111 by the execution engine 110.

In one embodiment, the register file 114 contains general purpose registers 112, special purpose registers 113 and loop counter registers 111. The special purpose registers 113 and the loop counter registers 111 are designed to speed up the decoding process and reduce the data traffic between the execution engine and external memory and storage memory.

In one embodiment, the loop counter registers 111 control how many times the execution engine 110 performs decoding operations to decode the current syntax element. For example, where there are 16 intra prediction modes in one macroblock, a loop counter is set to 16 and the execution engine 110 executes the "decode intra prediction mode" instructions 16 times to obtain the decoded syntax element from the input bitstream 120.

In one embodiment, the execution engine 110 includes a Context Adaptive Binary Arithmetic Coding (CABAC) module 108 and a Context Adaptive Variable Length Coding (CAVLC) module 109 to speed up the processing of CAVLC and CABAC processes, such H.264 bitstream decoding. The CABAC module 108 and the CAVLC module 109 are described in "Draft ITU-T Recommendation and Final Draft International Standard of Joint Video Specification" (ITU-T Rec. H.264 | ISO/IEC 14496-10 AVC). In one embodiment, the CAVLC module 109 and the CABAC module 108 share the table memory 102 with a standard Huffman variable length coding (VLC) table.

The CPU interface 115 receives commands from an external CPU to allow the external CPU to read the decoded syntax elements stored in CFIFO 116. In one embodiment, the entropy processor 100 can be used for the decoding bitstreams in accordance with multiple video and image coding standards, such as H.264, Motion Picture Experts Group (MPEG) 2, MPEG4, Society of Motion Picture and Television Engineers (SMPTE) 421M (VC1), H.263, Joint Photographics Experts Group (JPEG), by loading different information into the table memory 102.

FIG. 2 illustrates one embodiment of a variable length code and a corresponding table memory.

A Huffman table 200 includes a variable length code 0 which represents the value 3, a variable length code 11 which represents the value 0, a variable length code 101 which represents the value 1 and a variable length code 100 which represents the value 2. Each variable length code is a bit sequence for the corresponding value.

Figures 3A, 3B, 3C:
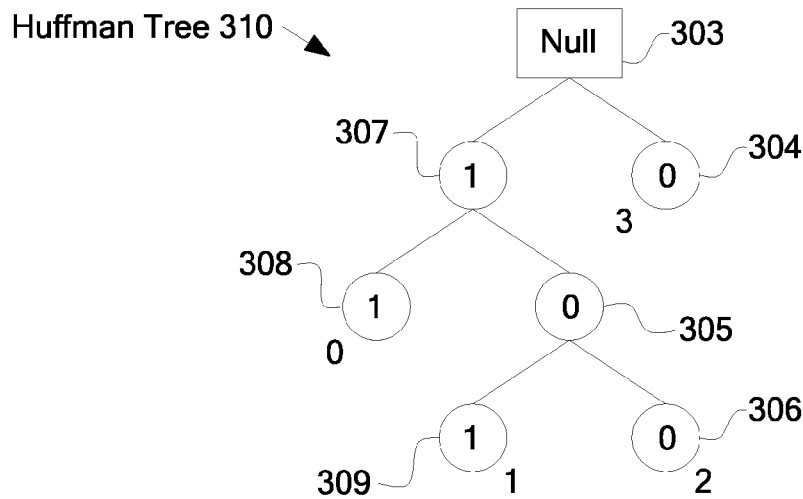
FIG. 3A illustrates one embodiment of a Huffman tree.
FIG. 3B illustrates one embodiment of a table memory of the present invention.
FIG. 3C illustrates another embodiment of a table memory of the present invention.

In one embodiment, the table memory 201 stores the opcodes and data to control the entropy processor to decode an input bitstream according to the corresponding variable length code. In one embodiment, the table memory 201 is organized to balance performance and code density. In one embodiment, the table memory 201 is a single table. In another embodiment, the table memory 201 includes more than one table. FIGS. 3B describes a decoding process using the table organization illustrated in table memory 201.

In one embodiment, the data structure for an instruction includes five fields: a getbits field (S), a showbits field (T), an immediate data field (D), an opcode field (O), and a destination field (Dest). The T field indicates how many bits from the first bit of input bitstream are used to decide the next address in the table. The S field indicates how many bits from the first bit of input bitstream are flushed from the input bitstream. The O field indicates how to translate the D field into the next table address or decoded value.

In one embodiment, opcodes ADV, LD0, LD1, LDT0, LDT1, LDT2, LDT3 and LDT4 are used in the decoding process. The ADV opcode uses a getbits field and a showbits field. The getbits field, which has a value of S, defines how many bits will be flushed from the bitstream. At the same time, the bit aligner outputs the value VAL as represented by the next T bits from the bitstream after the S bits are flushed.

The table address generator uses D, VAL and the current table address to generate the next address. For example, if the current address is Curr_Addr, the next address is Curr_Addr+ D+VAL. The next operation starts processing bits immediately following the last flushed bit. The T bits as specified in the showbits fields are not flushed and thus available for the next operation.

In one embodiment, the VLC decoding process starts with an ADV opcode. ADV is an intermediate step used to decode the VLC in stages. In one embodiment, ADV operation includes two operations in serial: flushbits(S) and VAL=showbits(T). The operation flushbits(S) flushes S bits from the input stream; and the operation VAL=showbits(T) outputs the value as defined by the first T bits in the input bitstream following the flushed bits.

The first ADV opcode has 0 in the getbits field and a non-zero showbits field. No bits are flushed, but the specified bits are output as VAL by the bit aligner. The following ADV opcodes have nonzero getbits fields and non-zero showbits fields. S bits are flushed and T bits are output as VAL by the bit aligner. After all the stages of the decode process are completed, other opcodes are used to load the decoded syntax element.

LD0, LD1 are used to load the decoded syntax element from the D field. The opcodes LDT0-4 are used to load the decoded syntax element from the D field and load the sign bit extracted from the bitstream.

In one embodiment, LD0 and LD1 are used to generate the decoded symbol value. LD0 #d A includes the following operations: A=#d, flushbits(s), stage=0 and execution done. A can be any storage defined in the Dest field, such as CFIFO, DFIFO, SFIFO or a register in the register file. LD0 loads #d into the low 8 bits of the register specified by the Dest field, flushes S bits from the input bit stream, resets the stage counter to 0 and ends execution of current LD0 instruction. LD1 #d+256 A includes the following operations: A=#d+256, flushbits(S), stage=0 and execution done. LD1 loads 256+#d into the low 9 bits of the register specified by the Dest field, flushes S bits from the input bit stream, resets the stage counter to 0 and ends execution of current LD1 instruction. LD0 is used when writing to storage with a value in the range of [0, 255]. LD1 is used when writing to storage with a value in the range of [256, 511].

In one embodiment, opcodes LDT0-4 are used to generate the RUN and LEVEL coefficients in an MPEG2 decoding process. The RUN and LEVEL (LEV) are compressed into an 8-bit D field.

LDT0 #d A includes the following operations, where A is {Run, LEV, SIGN}. A can be any storage defined in the Dest field, such as CFIFO, DFIFO, SFIFO or a register in the register file. RUN[5:0]=#d[7:2], LEV[11:0]=#d[1:0], flushbits(s), SIGN=getbits(1), Stage=0, and ends execution of LDT0 The value of RUN is assigned the high 6 bits of D. The value of LEV is assigned the low 2 bits of D. The sign is assigned the value of the next bit of the bitstream. The stage counter is reset to zero LDT1 #d A includes the following operations, where A is {Run, LEV, SIGN}. RUN[4:0]=#d[7:3], LEV[11:0]=#d[2:0], flushbits(s), SIGN=getbits(1), Stage=0, and LDT1 instruction execution done. The value of RUN is assigned the high 5 bits of D. The value of LEV is assigned the low 3 bits of D. The sign is assigned the value of the next bit of the bitstream. The stage counter is reset to zero.

LDT2 #d A includes the following operations, where A is {Run, LEV, SIGN}. RUN[3:0]=#d[7:4], LEV[11:0]=#d[3:0], flushbits(s), SIGN=getbits(1), Stage=0, and execution done. The value of RUN is assigned the high 4 bits of D. The value of LEV is assigned the low 4 bits of D. The sign is assigned the value of the next bit of the bitstream. The stage counter is reset to zero.

LDT3 #d A includes the following operations, where A is {Run, LEV, SIGN}. RUN[2:0]=#d[7:3], LEV[11:0]=#d[4:0], flushbits(s), SIGN=getbits(1), Stage=0, and execution done. The value of RUN is assigned the high 3 bits of D. The value of LEV is assigned the low 5 bits of D. The sign is assigned the value of the next bit of the bitstream. The stage counter is reset to zero.

LDT4 #d A includes the following operations, where A is {Run, LEV, SIGN}. RUN[2:0]=#d[7:3], LEV[11:0]=#d[4:0], flushbits(s), SIGN=getbits(1), Stage=0, and execution done. The value of RUN is assigned the high 3 bits of D. The value of LEV is assigned the low 5 bits of D. The sign is assigned the value of the next bit of the bitstream. The stage counter is reset to zero.

LDT4 #d A includes the following operations, where A is {Run, LEV, SIGN}. RUN[2:0]=#d[7:3], LEV[11:0]=#d[4:0], flushbits(s), SIGN=getbits(1), Stage=0, and execution done. The value of RUN is assigned the high 3 bits of D. The value of LEV is assigned the low 5 bits of D. The sign is assigned the value of the next bit of the bitstream. The stage counter is reset to zero.

A is stored in the memory location specified in the Dest field. The decoded syntax element can be stored in the CFIFO, DFIFO, SFIFO or the Register File, for example. The CFIFO is designed to store decoded syntax elements such as Motion vector, MBType, Ref idx. The DFIFO is designed to store the syntax elements such as Transform coefficients. The SFIFO is designed to store special values derived from the decoding process, such as the intra prediction mode and reconstructed motion vector (MV). The reconstructed MV can be used by the Video Signal Processor to get reference pixel data.

FIG. 3A illustrates one embodiment of a Huffman VLC.

A Huffman VLC is a general form of the variable length code. In one embodiment, the entropy processor can decode the Huffman VLC in an efficient way. The decoding process is carried out in one or more stages. Each stage can look up one or more bits. There is a tradeoff between the table size and number of stages. In video coding standards, there are different Huffman tables for different syntax elements. In order to get the best code density and decoding performance, it is desirable to use different lookup bits in different stages.

The Huffman tree 310 which is one way to define a Huffman encoding algorithm. At the beginning of the decoding process, the node 303 is accessed. The first bit of the VLC is retrieved. If the first bit is a 1, a pointer transitions to a node 307. If the first bit is a 0, the pointer transitions to a node 304 and the decoded syntax value is "3" and the decoding process is completed. At the node 307, the second bit of the VLC is retrieved. If the second bit is a 1, the pointer transitions to a node 308 and the decoded syntax value is "0" and the decoding process is completed. If the second bit is a 0, the pointer transitions to a node 305. At the node 305, the third bit of the VLC is retrieved. If the third bit is a 1, the pointer transitions to a node 309 and the decoded syntax value is "1" and the decoding process is completed. If the third bit is a 0, the pointer transitions to a node 306 and the decoded syntax value is "2" and the decoding process is completed.

FIG. 3B illustrates one embodiment of a table memory to represent the Huffman VLC illustrated in FIG. 3A.

Table 300 and Table 301 are examples of two decoding methods for the Huffman tree 310. Table 300 uses two lookup stages. The first stage uses 2 lookup bits and the second stage using 1 lookup bit. Table 301 uses three lookup stages, each stage using 1 lookup bit. The table size for both tables is 7. Table 300 has better decoding performance since it only needs 3 cycles to decode the 3-bit VLC. Two cycles are used to decode in each of two stages and one cycle is used to output the results. Table 301 uses 4 cycles to decode the 3-bit VLC. Three cycles are used to decode in each of two stages and one cycle is used to output the results.

For the table 300, processing begins at address 0, the first entry of the table 300. The ADV opcode is loaded at address 0 for the first stage of decoding. S is 0, T is 2 and D is 1 from the first entry of the table 300. Two bits are extracted from the input bitstream. The next address is the current address (0) plus D (1) plus VAL. The VAL of T can be 0, 1, 2 or 3, depending on the two bits extracted from the input bitstream.

If VAL is 0, the LD0 opcode is loaded from address 1 and the decoded syntax value is 3 from the D field at address 1. This result corresponds to the node 304 of the Huffman tree 310. If VAL is 1 the result is 3 from the D field at address 2. This result also corresponds to the node 304. If the first of the two bits was 0, the VLC completed with just one bit and the following bit is part of the next syntax element. Therefore, the second bit plays no role in determining the value of the current decoded syntax element.

If VAL is 3, the LD0 opcode is loaded at address 4 for the second stage of decoding. The decoded syntax value is 0 from the D value of address 4. This result corresponds to the node 308 of the Huffman tree 310.

If VAL is 2, the ADV opcode is loaded at address 3 for the second stage of decoding. S is 1, T is 2 and D is 2. Two bits are flushed. The VAL of T is 0 or 1 depending on the bit extracted from the incoming bitstream. If VAL is 0, the result is 2 loaded from the D field at address 5. This result also corresponds to the node 306 of the Huffman tree 310. If VAL is 1, the result is 1 loaded from the D field at address 6. This result also corresponds to the node 309 of the Huffman tree 310.

FIG. 3C illustrates one embodiment of a table memory to represent the Huffman VLC illustrated in FIG. 3A.

For the table 301, processing begins at address 0, the first entry of the table 301. The ADV opcode is loaded at address 0 for the first stage of decoding. S is 0, T is 1 and D is 1 from the first entry of the table 301. One bit is extracted from the input bitstream. The next address is the current address (0) plus D (1) plus VAL. The VAL of T can be 0 or 1 depending on the first bit extracted from the input bitstream.

If VAL is 0, the LD0 opcode is loaded from address 1 and the decoded syntax value is 3 from the D field at address 1. This result corresponds to the node 304 of the Huffman tree 310. If VAL is 1, the ADV opcode is loaded at address 2 for the second stage of decoding. S is 1, T is 1 and D is 0 from address 2. One bit is extracted from the input bitstream. One bit is flushed from the input bitstream. The next address is the current address (2) plus D (0) plus VAL. D is a value not less than or equal to 1 (D>=1). The VAL of T can be 0 or 1 depending on the second bit extracted from the input bitstream. This result corresponds to the node 307 of the Huffman tree 310.

If VAL is 1, the LD0 opcode is loaded from address 4 and the decoded syntax value is 0 from the D field at address 4. This result corresponds to the node 308 of the Huffman tree 310. If VAL is 0, the ADV opcode is loaded at address 3 for the second stage of decoding. S is 1, T is 1 and D is 2 from address 3. One bit is extracted from the input bitstream. One bit is flushed from the input bitstream. The next address is the current address (3) plus D (2) plus VAL. The VAL of T can be 0 or 1 depending on the second bit extracted from the input bitstream. This result corresponds to the node 305 of the Huffman tree 310.

If VAL is 0, the LD0 opcode is loaded from address 5 and the decoded syntax value is 2 from the D field at address 5. This result corresponds to the node 306 of the Huffman tree 310. If VAL is 1, the LD0 opcode is loaded from address 6 and the decoded syntax value is 1 from the D field at address 6. This result corresponds to the node 309 of the Huffman tree 310.

Figure 4:
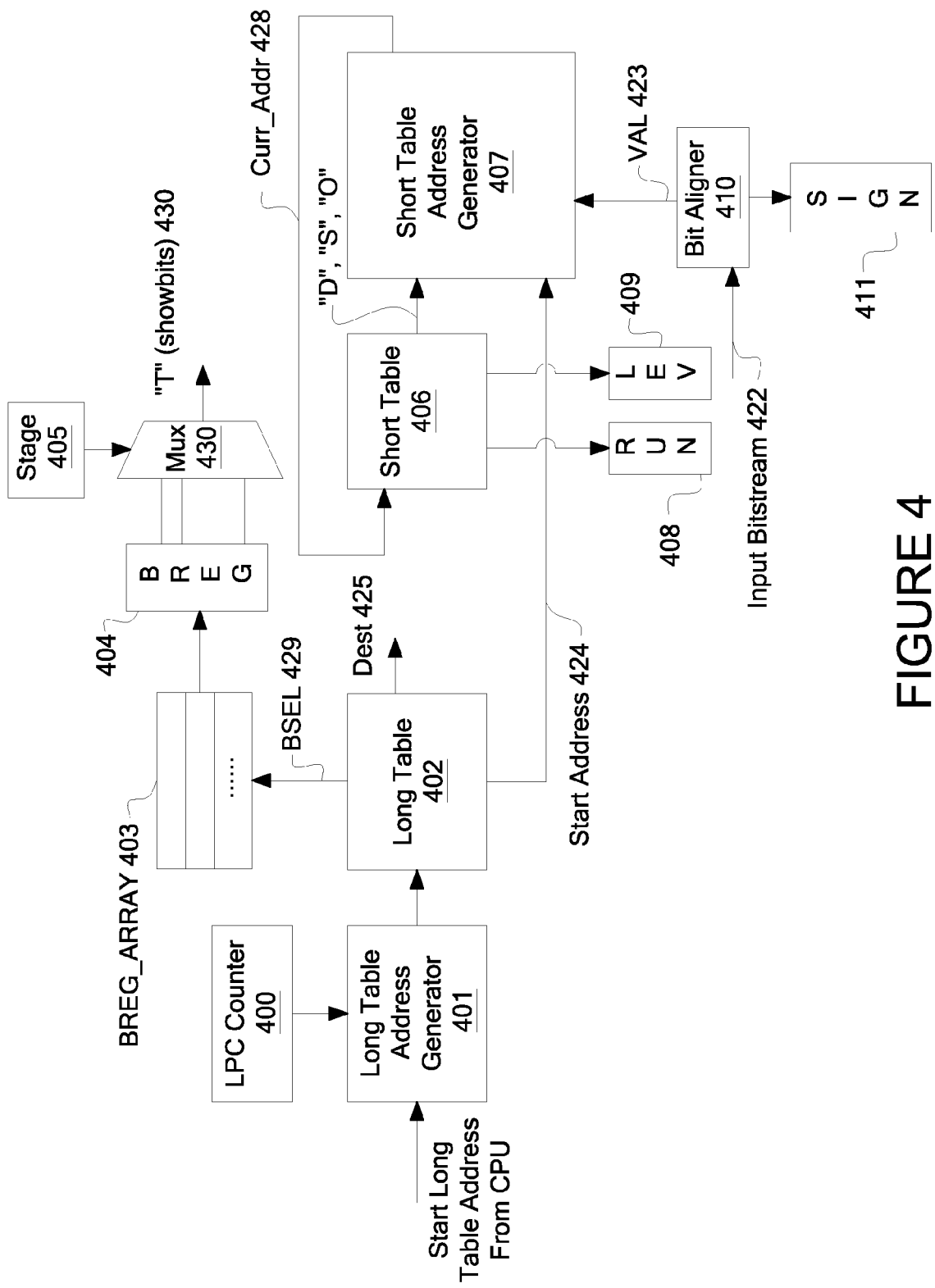
FIG. 4 illustrates one embodiment of an entropy processor of the present invention.

FIG. 4 illustrates an embodiment of an entropy processor.

In one embodiment, the table memory is broken into two tables in order to reduce table sizes. The S, O, and D fields are more frequently used than the T and Dest fields. The T and Dest fields are stored in a smaller table (a long table 402); and the fields S, O, and D are stored in a bigger table (a short table 406). In the long table 402, there is a field called "NXT PC" which is used to indicate the next execute address of the long table 402.

In one embodiment, the short table 406 includes 3 fields: an Operation field (O), an Immediate field (D) and a getbits field (S). In one embodiment, the long table 402 includes 5 fields. An Operation field (0), an Immediate field (D), a BSEL field (BSEL), a Dest field, and a condition.

The long table 402 starts execution from the address sent from the CPU. The first instruction fetched from this address is NXT instruction. The NXT instruction performs the following operations. Output the current lookup method: BREG=Breg_array[BSEL]; Output Dest Field; Output the start address of short table from Immediate field; Wait short table execution is finished. If short table execution is done, go to the next address.

In case of repeatedly decoding of a symbol, LPCL instruction is used to perform the following operations. Output the current lookup method: BREG=Breg_array[BSEL]; Output Dest Field; Output the start address of short table and execute the short instructions; Wait short table execution is finished. If LPC is not zero, decrease LPC, repeat execution of the same instruction else goto the next instruction.

The initial LPC value is set by executing SET instruction, with the Dest Field set as LPC and the initial value set in the immediate field of long table. In one embodiment, the actual showbits data are in the BREG_ARRAY; and the long table contains the pointers to select the sequence of showbits. In one embodiment, a bit aligner with dual shifter structure is designed to perform the getbits (S), showbits (T) operations in the same cycle.

A long table address generator 401 is configured to receive a start long table address from the a CPU. The long table 402 receives the long table address from the long table address generator 401. A LPC counter 400 generates a loop counter that indicates how many times the current address is sent to the long table 402 so that the fields at the current address are reused before incrementing to the next address in the long table 402 as indicated by the NXT PC field.

The long table 402 generates a BSEL field 429 and a Dest field 425 from the current address BSEL 429 is used to select one lookup method from a BREG_ARRAY 403. The selected entry of BREG_ARRAY 403 is stored in BREG 404 and represents the selected lookup method. The lookup method defines how many lookup bits are used in each stage of decoding. In one implementation, BSEL 429 is 3 bits and BREG_ARRAY 403 has up to 8 entries. There are maximum 8 lookup methods are stored in the BREG_ARRAY 403. According to different implementations, more or less lookup methods can be made available.

BREG 404 is output through a multiplexer (mux) 430. BREG 404 could be registered or directly from the multiplexer 430. Another special register, STAGE 405, is used to store the stage number of the VLC decoding. In one embodiment, if the stage number exceeds 8, uses the lookup bit number defined for stage 8. A lookup method defines a set of T fields for each of the stages of the decoding process.

For example, a first entry stores lookup method "44444456" and a second entry stores lookup method "12222233". The first entry means the lookup bits are defined as follows: Stage 1: lookup 6 bits; Stage 2: lookup 5 bits; Stage 3-8: lookup 4 bits; Stage 9 and later, lookup 4 bits. The second entry means the lookup bits are defined as follows: Stage 1: lookup 3 bits; Stage 2-7: lookup 3 bits; Stage 8: lookup 1 bits; Stage 9 and later, lookup 1 bits.

To decode one syntax element (symbol), the relative settings of T and Dest are read out in the first cycle from the long table 402; then the other fields, including S, O, and D are read out in the successive cycles for each stage of the lookup method and the loading of the decoded syntax element.

A short address table generator 407 receives D from the short table 406, VAL from the bit aligner 410 and the current address from either the long table 402 (for the starting address) or from the previous cycle of the short table address generator 407 (for subsequent addresses). The short address table generator is described in more detail with respect to FIGS. 5 and 6.

A bit aligner 410 receives an input bitstream 422, S and T. The bit aligner 410 flushes S bits of the input bitstream 422 and outputs the VAL of a set of T bits from the input bitstream 422. The bit aligner 410 is described in more detail with respect to FIG. 7.

In one embodiment, the output of the decoded syntax element is output to RUN 408 and LEV 409 from the D value in the short table and SIGN 411 by the bit aligner 410 from the input bitstream 422. In another embodiment, the output of the decoded syntax element is out to one a number of registers or FIFOs (not illustrated in this figure) based on the Dest field.

Figure 5:
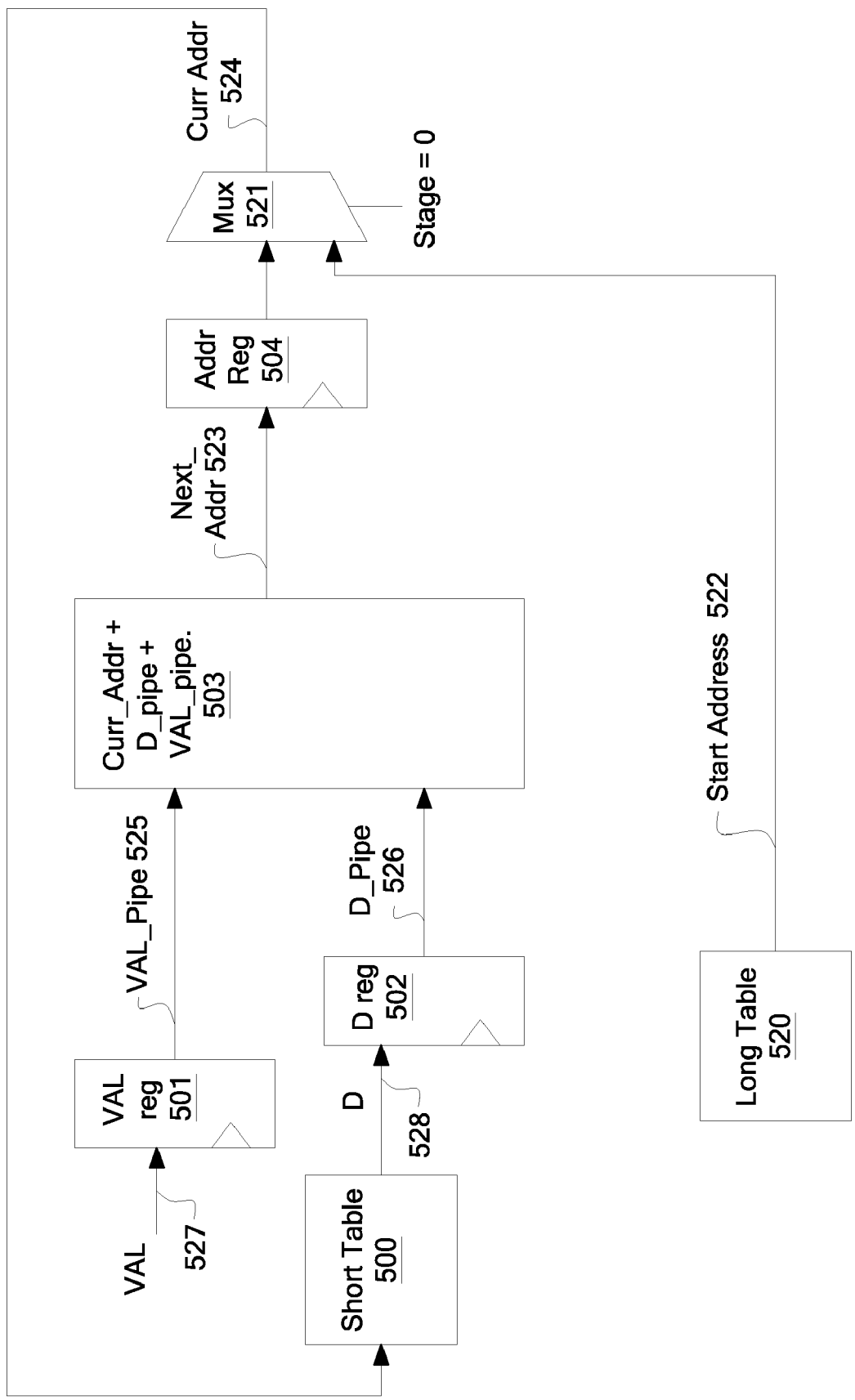
FIG. 5 illustrates one embodiment of a short table address generator of the present invention.

FIG. 5 illustrates one embodiment of a short table address generator.

To support fast clock frequency, a short table address generator 510 is designed with two pipeline stages. D from the short table 500 comes out in the next cycle of the input address (Next_addr 523). The output of the short table is latched before it goes to the address generator. There are three pipeline registers: a VAL register 501, a D register 502, and an address register 504. Curr_Addr 524 is input as the current address for the short table 500.

If stage=0, long table 520 outputs is selected as the output of multiplexer near "next A"; otherwise, the output of "Curr_Addr+D+VAL" is selected as the output of multiplexer 521. In one embodiment, the combinational logic of long table address generator is as follows: Next_Long_Address=CPU_send_address?CPU_Start_Address: LPC==0?Current_long_Address+1: Current_long_Address.

Figure 6:
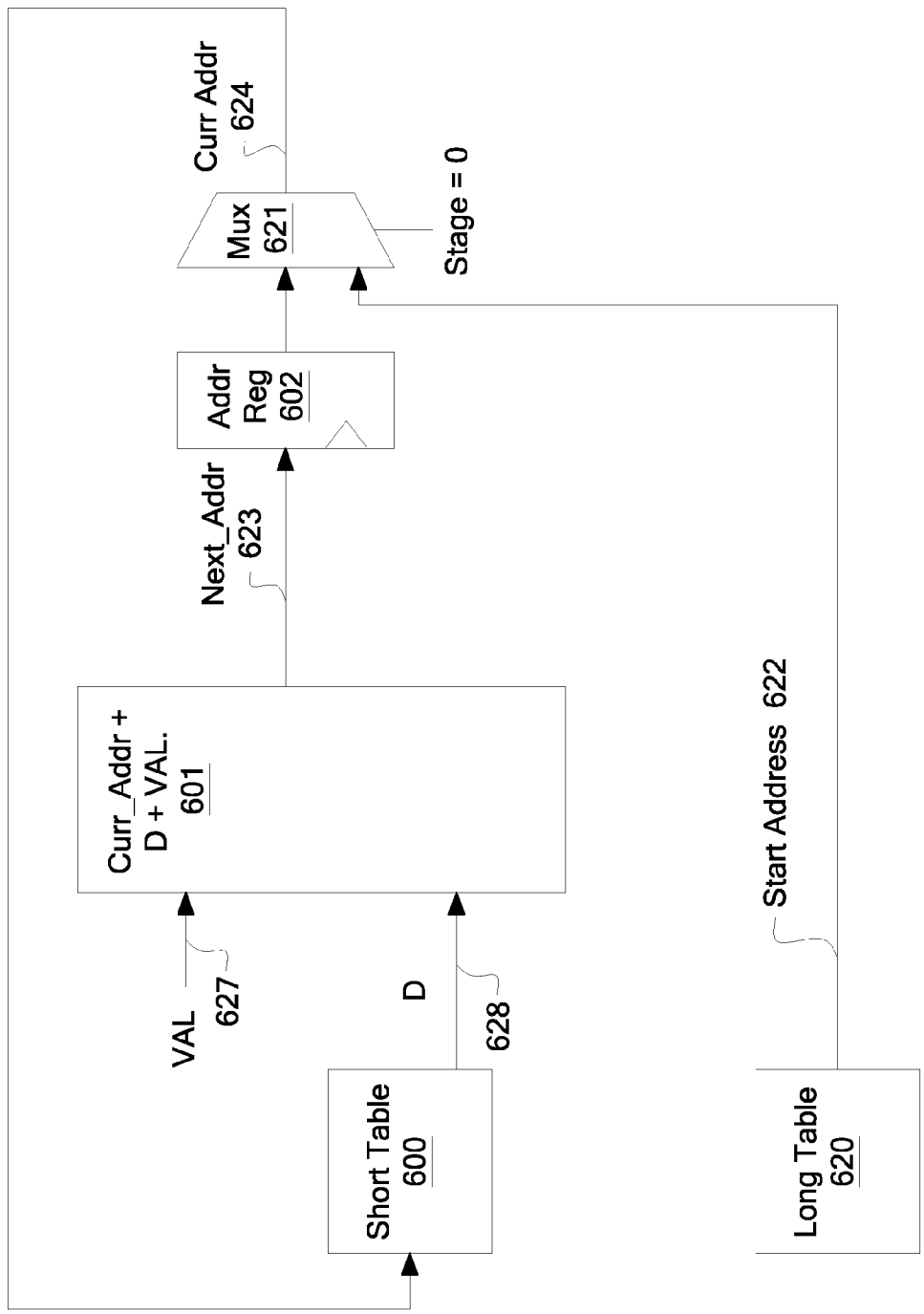
FIG. 6 illustrates one embodiment of a short table address generator of the present invention.

FIG. 6 illustrates one embodiment of a short table address generator.

In case of applications which do not need high clock frequency, a one-pipeline stage short table address generator 510 can be designed. The output of the short table 500 comes out in the next cycle of the input address (Next_addr). The address of long table comes from a long table generator.

Figure 7:
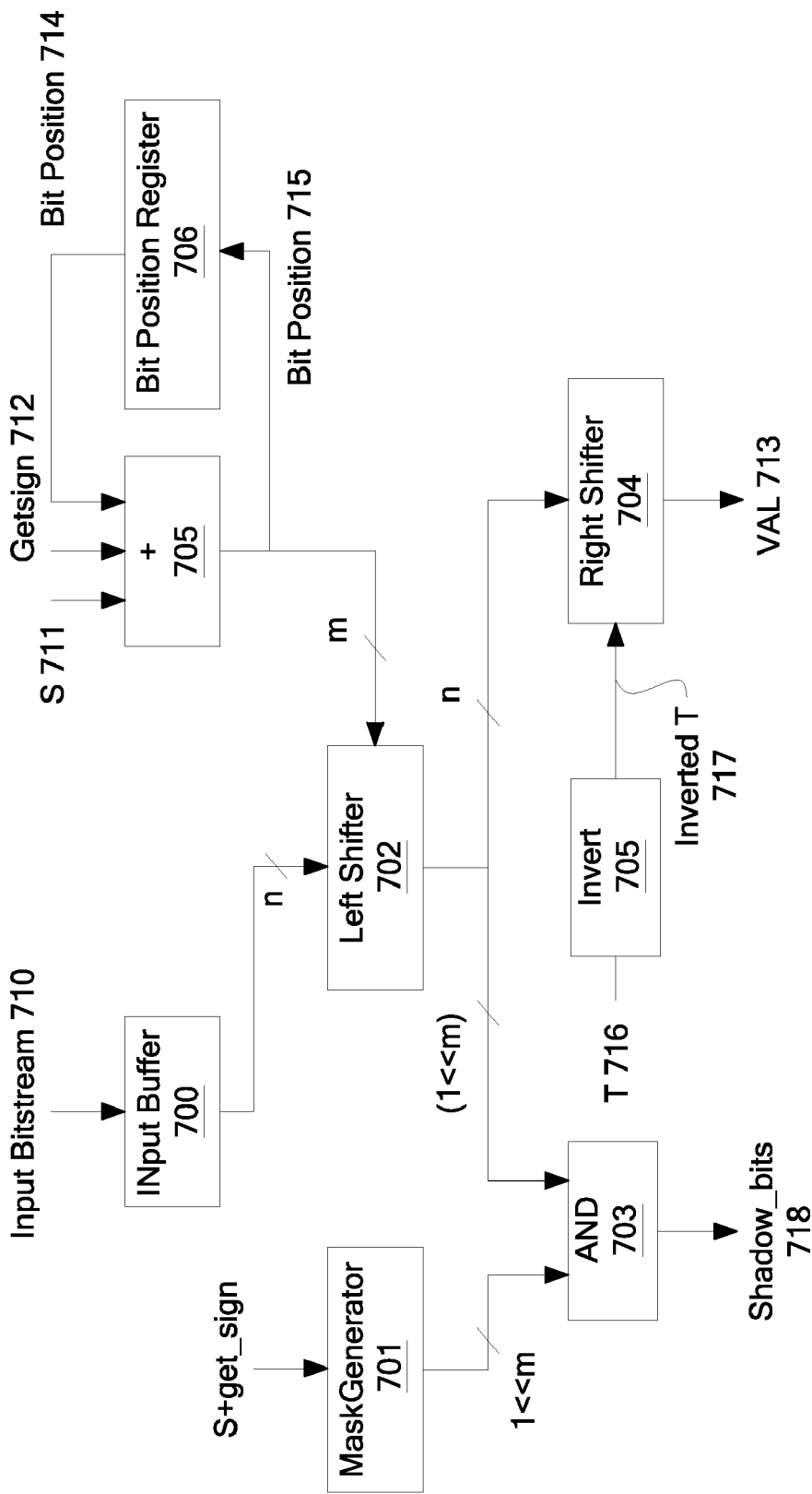
FIG. 7 illustrates one embodiment of a bit aligner of the present invention.

FIG. 7 illustrates one embodiment of a bit aligner of the present invention.

A bit aligner 710 is designed to support an efficient lookup process. The bit aligner 710 can flush S bits and at the same time output (or show) the next T bits. This feature is very useful when executing the ADV opcode. The ADV opcode is used in VLC decoding. In VLC decoding, the execution engine provides the S from the getbits field and T from the showbits field in the table memory. The last T bits of the S+T bits are used to decide the next table address. Bits 1 through bit S are used to generate S and bit S+1 to bit S+T are used to generate T. For the next operation, the getbits starts from bit S+1. The front S bits are also called shadow_bits, and the last T bits are also called front_bits.

The bit aligner 710 can flush the S bits and at the same time extract the next one sign bit. This feature is also very useful when executing LDT0-4 opcodes. LDT0-4 opcodes are used in the last step in decoding coefficient VLC in MPEG2, where the coefficient VLC is followed by a sign bit. In this case, the coefficient VLC and sign bit are decoded in the same cycle. The sign bit is in the LSB of extracted (S+1) bits. S is bit 1 to bit S and the sign bit is bit S+1.

A bit position register 706 maintains the bit position with an input bitstream 711. An adder 705 receives S 712, a getsign 713 and a bit position 714 and adds these values to generate a bit position 715. The S 715 is the number of bits to be flushed and the getsign 713 is a 1 if the next bit after the S bits is to be extracted as a sign bit and a 0 if the next bit is not to be extracted as a sign bit. Getsign 713 is 0 when executing "ADV" or "LD" opcodes. getsign 713 is 1 when executing "LDT" opcodes. In case of "LDT", the least significant bit of the shadow_bits 712 is stored into the sign register.

The bit position 715 is saved in the bit position register 706 as the current bit position and used as the bit position 714 for the next reference to the bit position register 706.

A left shifter 702 is configured to receive an n bit input data from an input bitstream 711 through an input buffer 700. The left shifter left shift the n bit input by m bits. The m bits are indicated by the bit position 715.

A right shifter 704 receives n bits starting from the bit position 715 as output from the left shifter 702. An inverter 705 receives T 716 and generates inverted T 717. Inverted T 717 indicates the number of bits to right shift the n bits received from the left shifter 702. The right shifter 704 places the first T bits of the input received from the left shifter in the least significant position of VAL 713 and the remaining bits will be zero.

An AND module 703 receives the n bits in front of the bit position 714 and a mask from a mask generator 701. The mask generator has generates a mask with S+getsign 1 bits in the least significant positions and 0 elsewhere. The output of the AND 703 are the shadow bits 718 which are the bits that are flushed in this operation.

For example, the input stream is 11011001011 . . . , get_sign=0, the current bit position in the Register is 1, the bit-width of adder output is m=3, the bitwidth of input buffer is n=8, the first bit is 1, S=2 and T=2 . . . the input to the left shift from the adder is: 2, the output of the left shifter is: {00000110_11001011}; the output of the mask generator is:00000011; the input to the AND logic is: 00000011 and 00000110 the output of the AND logic is 00000010; the input to the right shifter is: 11001011, input to Invert is T=010 (binary), output from the invert is 101 (binary), the output of the right shifter front_bits (VAL) is: 00000011. The sign bit is in the LSB of shadow_bits.

Figure 8:
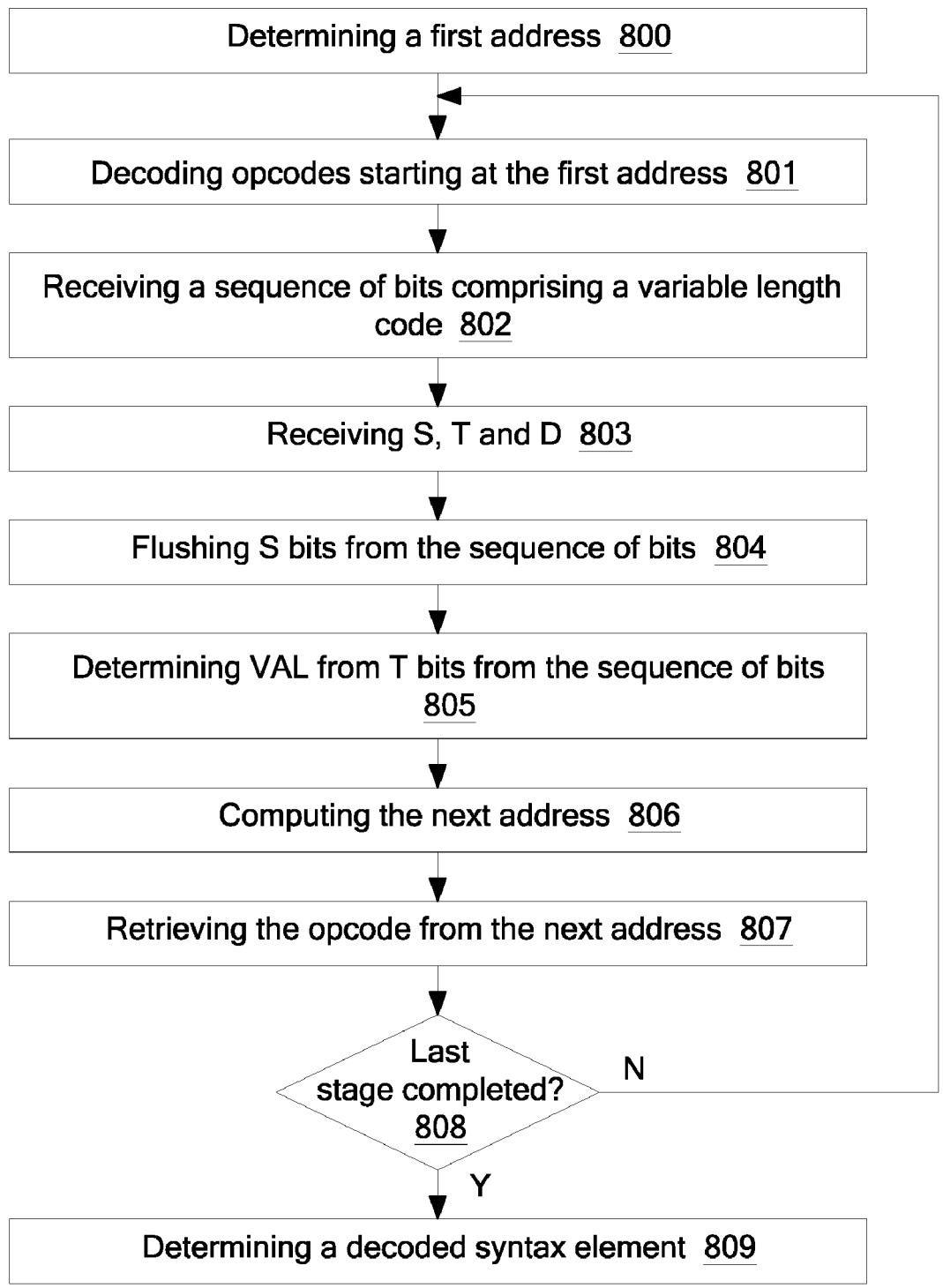
FIG. 8 illustrates one embodiment of method of decoding a variable length code.

FIG. 8 illustrates one embodiment of a method of performing variable length decoding.

In process 800, a first address is determined. In one embodiment the first address is determined from a long table in the table memory. The long table receives a start address from a CPU and generates a Dest address and first address based on the start address.

In process 801, an opcode is decoded. In one embodiment, an ADV opcode is used to perform one stage of a multi-stage decode process as described herein.

In process 802, a sequence of bits comprising a variable length code is received. Some standards using variable length codes are H.264, MPEG2, MPEG4, VC1, H.263, and JPEG.

In process 803, S, T and D are received from the table memory at the current short table address.

In process 804, S bits are flushed from the sequence of bits.

In process 805, VAL is determined from the T bits extracted from the sequence of bits.

In process 806, the next address is computed. In one embodiment, the next address is computed by adding the current address, D and VAL. The next address depends on the decoding of the T bits represented by VAL by influencing the next address calculation. The opcode is retrieved from the next address. The next address becomes the current address and the opcode is executed.

In process 807, an opcode is received from the next address.

In process 808 it is determined if the last stage is completed. In one embodiment, this is determined based on the opcode retrieved. If the opcode retrieved is an ADV opcode, another stage of decoding is performed. If the opcode retrieved is an LD0-1 or LDT0-4 opcodes, a decoded syntax element is retrieved according to some embodiments of the invention.

Figure 9:
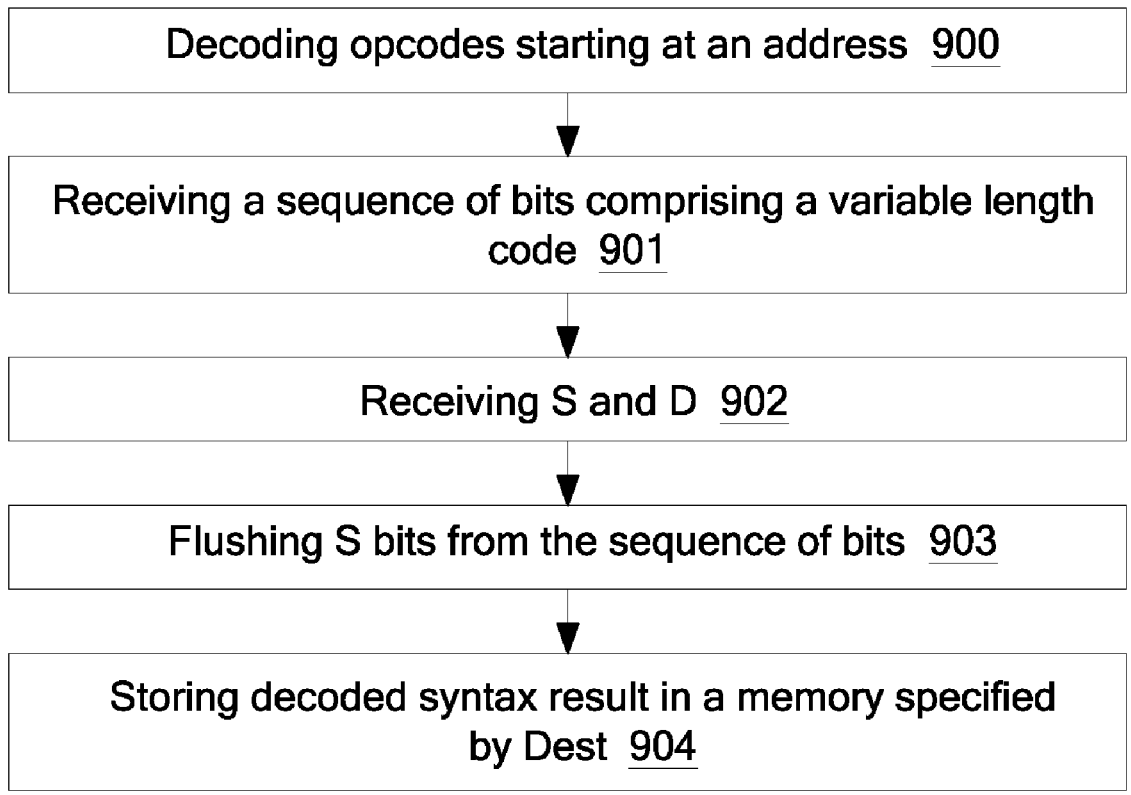
FIG. 9 illustrates one embodiment of retrieving a decoded syntax element after decoding a variable length code.
Figure 10:
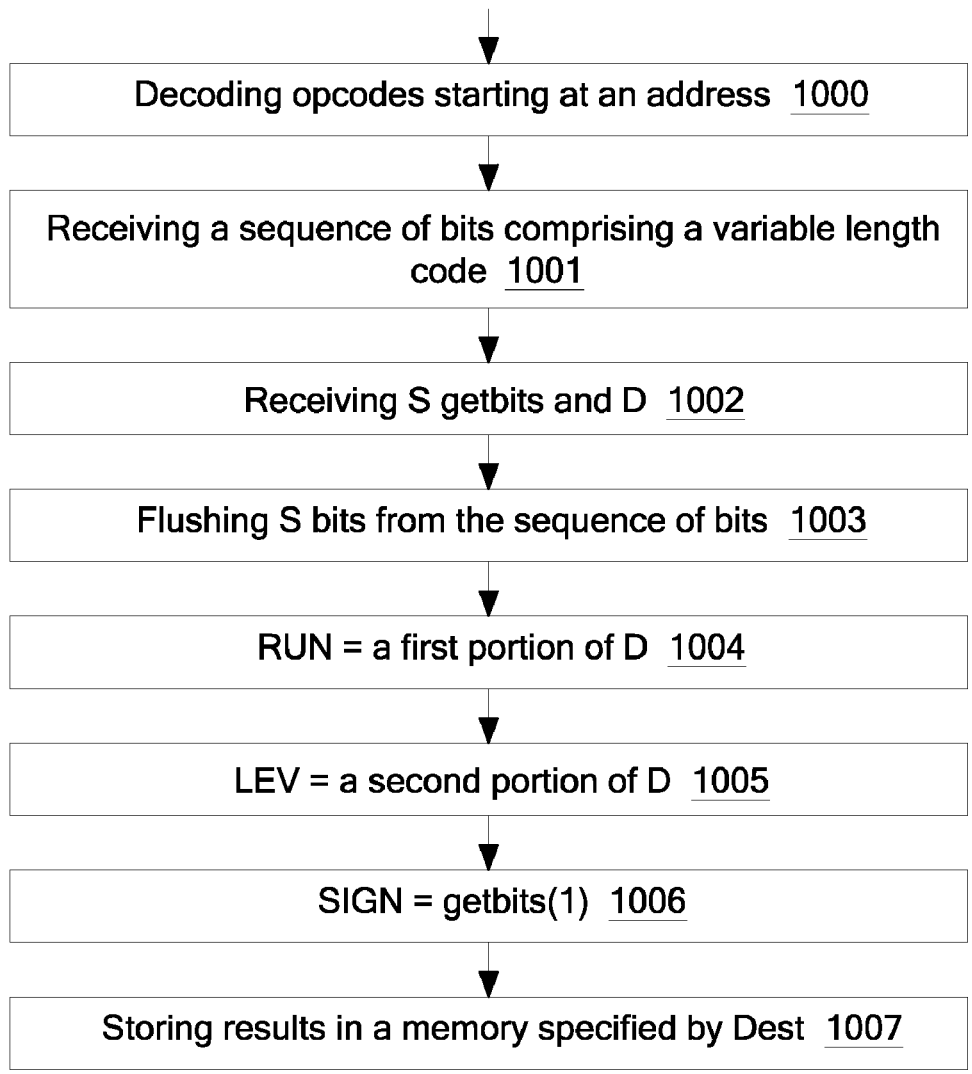
FIG. 10 illustrates another embodiment of retrieving a decoded syntax element after decoding a variable length code.

In process 809, a decoded syntax element is determined. FIG. 9 and FIG. 10 illustrated two embodiments of a process to determine a decoded syntax element.

FIG. 9 illustrates a method retrieving a decoded syntax element according to one embodiment of the present invention.

In process 900, an LD0 or LD1 opcode is decoded. These instructions are performed after a decoding process is performed according to one embodiment of the invention. The current address in the table memory depends on the decoding process and the decoded syntax element can be found in one or more addresses starting at the current address.

In process 901, a sequence of bits comprising a variable length code is received. Some standards using variable length codes are H.264, MPEG2, MPEG4, VC1, H.263, and JPEG.

In process 902, S and D are received from the table memory at the current short table address.

In process 903, S bits are flushed from the sequence of bits.

In process 904, D is stored at a memory location based on the Dest field. D is the decoded syntax element. In one embodiment, the Dest field is received from the long table memory. The Dest field may specify one of several registers in a register file or one of several FIFOs as described herein.

FIG. 10 illustrates a method retrieving a decoded syntax element according to one embodiment of the present invention.

In process 1000, an LDT0, LDT1, LDT2, LDT3 or LDT4 opcode is decoded. These instructions are performed after a decoding process is performed according to one embodiment of the invention. The current address in the table memory depends on the decoding process and the decoded syntax element can be found at the current address.

In process 1001, a sequence of bits comprising a variable length code is received. Some standards using variable length codes are H.264, MPEG2, MPEG4, VC1, H.263, and JPEG.

In process 1002, S and D are received from the table memory at the current short table address.

In process 1003, S bits are flushed from the sequence of bits.

In process 1004, the RUN decoded syntax element is generated using a portion of the D value. If the LD0 opcode is used, RUN is the most significant 6 bits of D. If the LD1 opcode is used, RUN is the most significant 5 bits of D. If the LD2 opcode is used, RUN is the most significant 4 bits of D. If the LD3 opcode is used, RUN is the most significant 3 bits of D. If the LD4 opcode is used, RUN is the most significant 2 bits of D.

In process 1005, the LEV decoded syntax element is generated using a portion of the D value. If the LD0 opcode is used, LEV is the least significant 2 bits of D. If the LD1 opcode is used, LEV is the least significant 3 bits of D. If the LD2 opcode is used, RUN is the least significant 4 bits of D. If the LD3 opcode is used, LEV is the least significant 5 bits of D. If the LD4 opcode is used, LEV is the least significant 6 bits of D.

In process 1006, the SIGN is retrieved from the first bit after the S bits flushed from the sequence of bits.

In process 1007, the decoded syntax element is stored at a memory location based on the Dest field. In one embodiment, the Dest field is received from the long table memory. The Dest field may specify one of several registers in a register file or one of several FIFOs as described herein.

Figure 11:
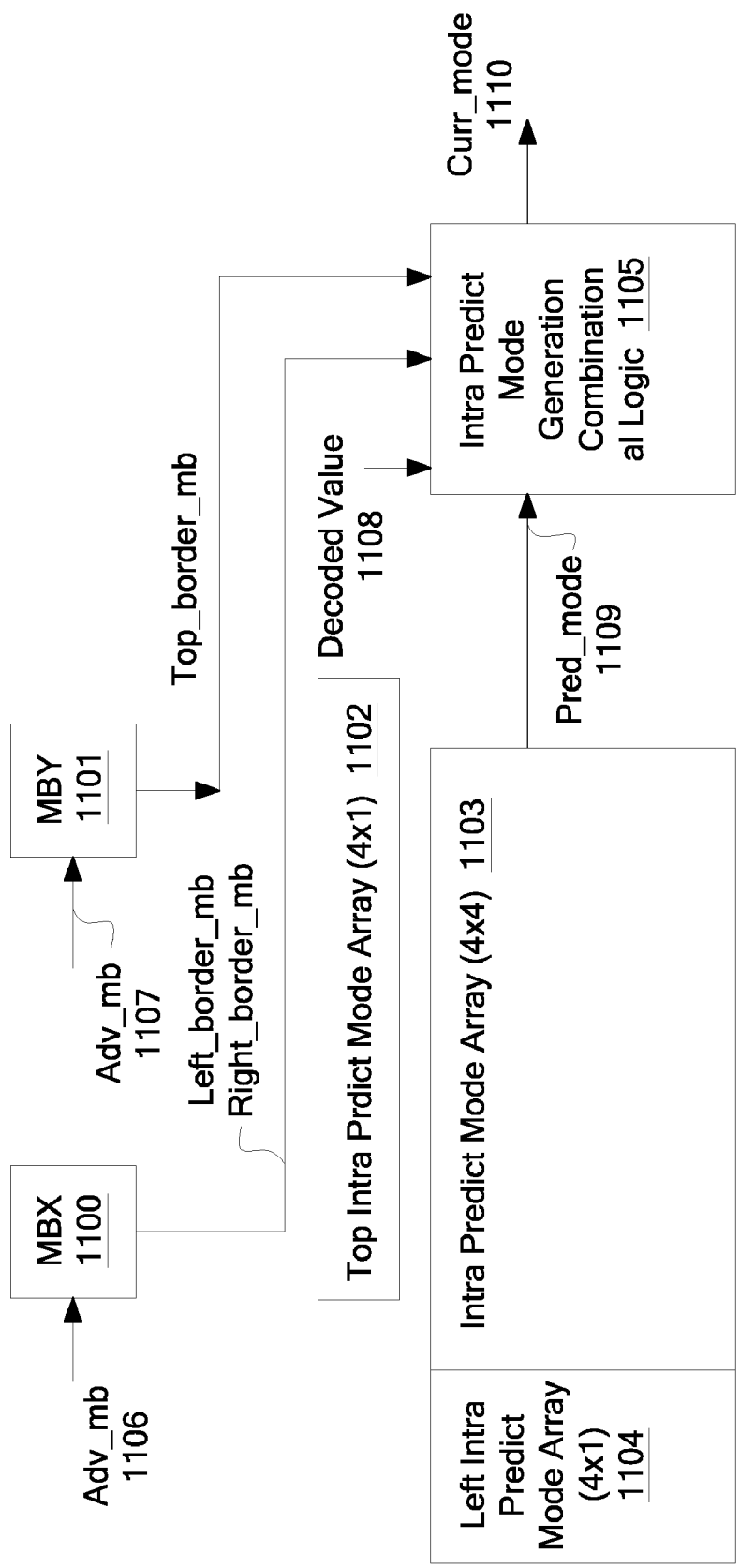
FIG. 11 illustrates one embodiment of a video decoder system.

FIG. 11 illustrates one embodiment of video decoder system.

In one embodiment, a method is designed to generate Intra Predict Mode using combined VLC decoding without CPU assistance.

In the H.264 standard[1], to generate the intra predict mode, there are several steps:

```
luma4x4BlkIdx =0;
Decode prev_intra4x4_pred_mode_flag[ luma4x4BlkIdx ] from
bitstream;
If prev_intra4x4_pred_mode_flag[ luma4x4BlkIdx ] is not zero,
  decode rem_intra4x4_pred_mode[ luma4x4BlkIdx ].
Then the intra predict mode is generated as follows:
predIntra4x4PredMode = Min( intra4x4PredModeA,
intra4x4PredModeB )
if( prev_intra4x4_pred_mode_flag[ luma4x4BlkIdx ] )
   Intra4x4PredMode[ luma4x4BlkIdx ] = predIntra4x4PredMode
else
   if( rem_intra4x4_pred_mode[ luma4x4BlkIdx ] <
predIntra4x4PredMode )
     Intra4x4PredMode[ luma4x4BlkIdx ] =
     rem_intra4x4_pred_mode[ luma4x4BlkIdx ]
   else
     Intra4x4PredMode[ luma4x4BlkIdx ] =
     rem_intra4x4_pred_mode[ luma4x4BlkIdx ] + 1
luma4x4BlkIdx is from 0 to 15.
```

Traditional method needs to decode two symbols to generate the final intra4x4PredMode. First to get the one prev_intra4x4_pred_mode_flag, then based on this flag, the decoding of another symbol called rem_intra4x4_pred_ mode is done or bypassed.

In one embodiment, a combined decode method is designed to decode the intra4x4PredMode. The operation is done in one cycle for each loop using the following method.

1) There are two counters, called MBX and MBY to store the location of current Macroblock. Combinational logics are used to generate the three flags: left_border_mb, right_border_mb and top_border_mb. These flags are used to derive the default values if the neighboring MB does not exist.

2) There are two dimensional register array, which consists of a 4×4 register array to store the intra predict mode of current MB, a 4×1 register array to store the top pred mode and a 4×1 register array to store the left pred mode.

3) The prev_intra4×4_pred_mode_flag and rem_intra4× 4_pred_mode are combined together and decoded using the following new table. 255 is used to indicate when rem_intra4x4_pred_mode is not needed to be decoded and the neighboring intra prediction mode is used to derive the current intra predict mode.

4) There is a combinational Logic to calculate the current predict mode. The Decoded Value is generated from the Lookup table. The Pred_mode is generated by accessing the two dimensional register array. The combinational logic includes two compare operators, one adder, and two multiplexers. For example:

```
luma4x4BlkIdx =0;
Decode combined_intra4x4_pred_mode_flag[ luma4x4BlkIdx ] from
bitstream;
(1) predIntra4x4PredMode = Min( intra4x4PredModeA,
intra4x4PredModeB )
(2) If combined_intra4x4_pred_mode_flag[ luma4x4BlkIdx ] is 255
   Intra4x4PredMode[ luma4x4BlkIdx ] = predIntra4x4PredMode;
(3) Else:
     if( combined_intra4x4_pred_mode[ luma4x4BlkIdx ] <
     predIntra4x4PredMode )
     Intra4x4PredMode[ luma4x4BlkIdx ] =
     combined_intra4x4_pred_mode[ luma4x4BlkIdx ]
   else
     Intra4x4PredMode[ luma4x4BlkIdx ] =
     combined_intra4x4_pred_mode[ luma4x4BlkIdx ] + 1
luma4x4BlkIdx is from 0 to 15.
```

The above (1), (2), (3) operations are done in the combinational logics as in FIG. 8.

In one embodiment, the decoding intra prediction mode uses four long instructions. The method 0 is defined as 0x22222223. The method 0 can also be other values.

| (1) BS0 | CC16 NXT D2 #vlx_h264_ht_3 | // ue_imbtype r0+cfifo */ |
|---|---|---|
| (2) BS0 | CC16 CMP D0 #0xe0a0 | // compare r0[7:5] == 5 (I4)*/ |
| (3) BS0 | CC17 SET D5 #16 | // set LPC |
| (4) BS0 | CC17 LPCL D1 #vlx_h264_ht_1 | // get intra predict mode */ |

In (1) BS0 means lookup method 0, designed for syntax completeness. CC16 means always TRUE. D2 means the CFIFO and R0 as destination. #vlx_h264_ht_3 means the start address of the MBTYPE short table. NXT will execute the same instruction and go to the next instruction after short table finishes execution. If the MBType is Intra 4×4 mode, R0[7:5] is stored with value 0x5. R0[4:0] is stored with value 0.

In (2) BS0 means lookup method 0, designed for syntax completeness. CMP is a compare instruction. It does the following operation: If (R0[7:0] & 0xe0==0xa0) comparison result is TRUE; Else comparison result is FALSE. If the MBType is Intra 4×4 mode, R0[7:5] is stored with value 0x5. So R0[7:0] & 0xe0=0xa0, and the comparison result is TRUE. D0 is 0, designed for syntax completeness.

In (3) BS0 means lookup method 0, designed for syntax completeness. CC17 means the comparison result in last instruction (1) is true. D5 means the LPC special register. LPC is loaded with immediate field, which is 16.

In (4) BS0 means lookup method 0. CC17 means the comparison result in last instruction (1) is true. D1 means the CFIFO as destination. #vlx_h264_ht_1 means the start address of the short table. LPCL will execute the same instruction for number of times specified in LPC, which is 16.

TABLE 1

| Combined Intra predict mode VLC code | The Decoded Value |
|---|---|
| 1 | 255 |
| 0000 | 0 |
| 0001 | 1 |
| 0010 | 2 |
| 0011 | 3 |
| 0100 | 4 |
| 0101 | 5 |
| 0110 | 6 |
| 0111 | 7 |

Figure 12:
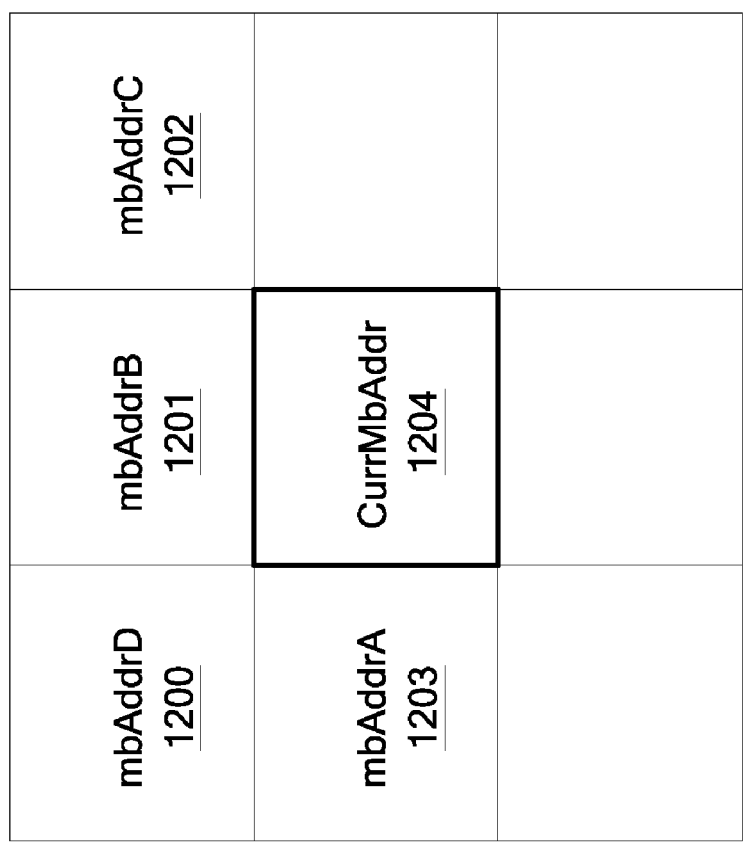
FIG. 12 illustrates one embodiment of two dimensional register array.

FIG. 12 illustrates one embodiment of two dimensional register array structure.

Motion Vector Prediction and reconstruction. In one embodiment, a multiple two-dimensional register array structure is designed for Motion Vector (MV) prediction and MV generation. The operations equivalent to the functions of MV Prediction and reconstruction are described in H.264 Standard [1].

A traditional method to get MV needs a CPU to do the MV prediction and reconstruction. There are heavy traffic between VLC decoder and the CPU since the CPU needs to read out many syntax elements from the VLC decoder in order to carry out the prediction and reconstruction.

In one embodiment, the MV prediction and reconstruction are done hardwired and finished in one cycle and carried out in two pipeline stages without CPU assistance.

Figure 14:
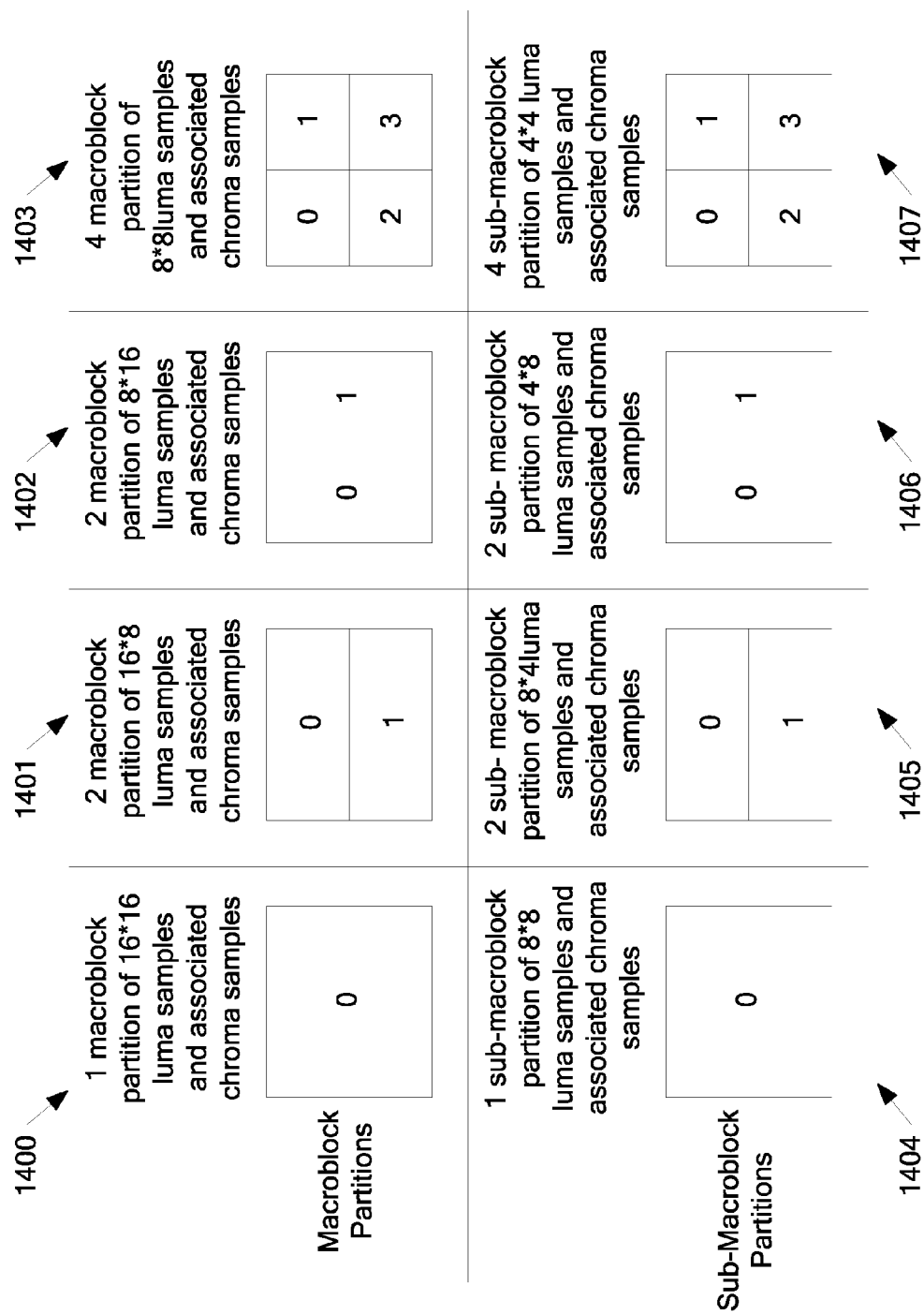
FIG. 14 illustrates one embodiment of macroblock and sub-macroblock partitions.

In one embodiment, the MV prediction and reconstruction are done inside the Entropy Processor. In one embodiment, all the components in FIG. 1 are integrated on a same chip. In one embodiment, the VRISC in FIG. 14 is integrated with the entropy processor on the same chip; alternatively, the VRISC and the entropy processor in FIG. 14 are integrated on different, separate chips.

Figure 13:
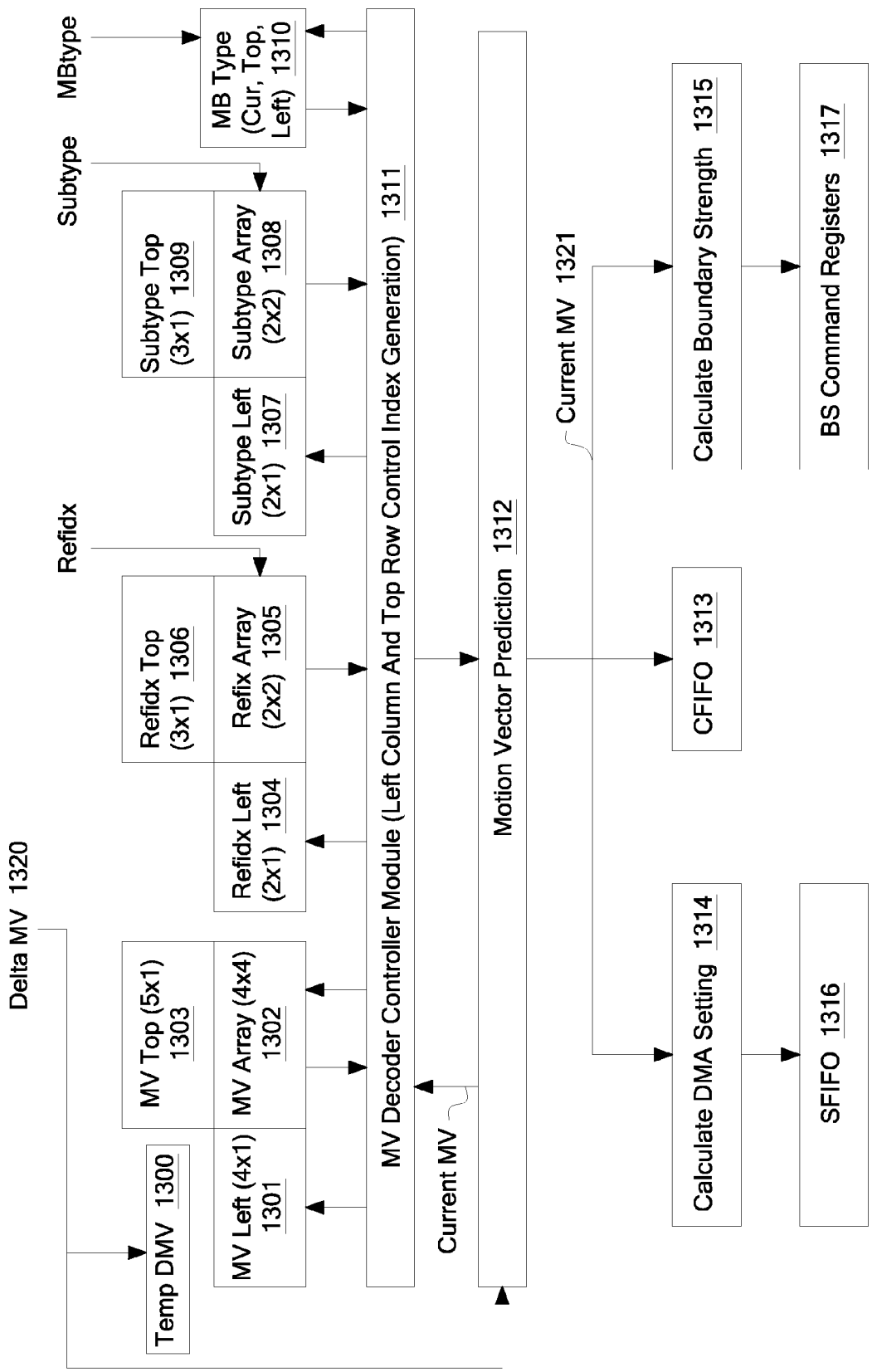
FIG. 13 illustrates one embodiment of an video decoder system.

FIG. 13 illustrates one embodiment of video decoder system.

In order to reduce the traffic between entropy processor and external CPU and external memory, multiple two-dimensional register arrays are designed. Four separate pieces of register arrays are used to store four types of syntax elements. Each register array stores the syntax elements in the current Macroblock as well as syntax elements in the neighboring Macroblock. Each register array has its own read address and write address. There is an address calculation circuit to generate the addresses of neighboring sub-block based on the current sub-block index. The generated addresses are used to read out the syntax element in the top border sub-block and the syntax element in the left border sub-block. So each read port outputs three data, current, top data from top row (N+1)×1 array, left data from left column (N+1)×1 array, at the same time. In one embodiment, the shape for register array designed to have the same shape of the macroblock so that the current, top, left row/column are read at the same time.

Each register array contains N×N array for current macroblock and (N+1)×1 array for the top macroblock row, N×1 array for the left macroblock column. For Motion Vector (MV) array, N=4. For Refidx and subtype array, N=2. For MBType, N=1. The Register arrays are controlled by MV decoder controller module. The MV decoder controller module generates the indexes for the four register array in parallel and reads out the current and neighboring information from the register array. The MV Prediction module reads the current and neighboring information and calculates the current MV. Using one index, three values can be read out from (N×N), (N+1)×1 and N×1 array at the same cycle. If the index is on the border of N×N block, then the (N+1)×1 array will be read out together as the neighboring elements. The current MV results are written into the Register array and sent out to the CFIFO as well.

In one embodiment, a method is designed to generate the Motion Vector (MV) based on the Delta MV and neighboring MV inside the Entropy Processor to reduce the traffic to the external CPU and to reduce memory storage.

The execution engine decodes the DeltaMV and writes the results to a temporary register (Tmp DMV). At the same time, the DeltaMV are bypassed to the Motion Vector Prediction Module. In the next cycle CurrMV is calculated from Motion Vector Prediction Module. The CurrMV is stored into MV array and Tmp DMV is stored into CFIFO at the same time. The CurrMV is also sent to Calculate DMA Setting module; and the DMA setting parameters are stored into the SFIFO. The CurrMV is sent to the Calculate Boundary Strength module; and the boundary strength results are stored into the BS Command registers. The External CPU or Video Signal Processor can read the BS Command registers and the SFIFO. The BS Commands are used to configure the Video Signal Processor(VSP) and VSP does the Deblock Filtering according to the BS Commands.

There are variable numbers of MVs in one Macroblock depending on the block partition of a macroblock. The maximum number of MVs in one Macroblock is 16, when the Macroblock is partitioned as 16 4×4 sub-blocks. There are three registers, two general purpose register R0 and R1, and Loop counter, called LPC, which is loaded with the MV counter derived from the macroblock and sub-macroblock partition, are used to speed up the deriving how many MVs in the Macroblock.

Figure 15:
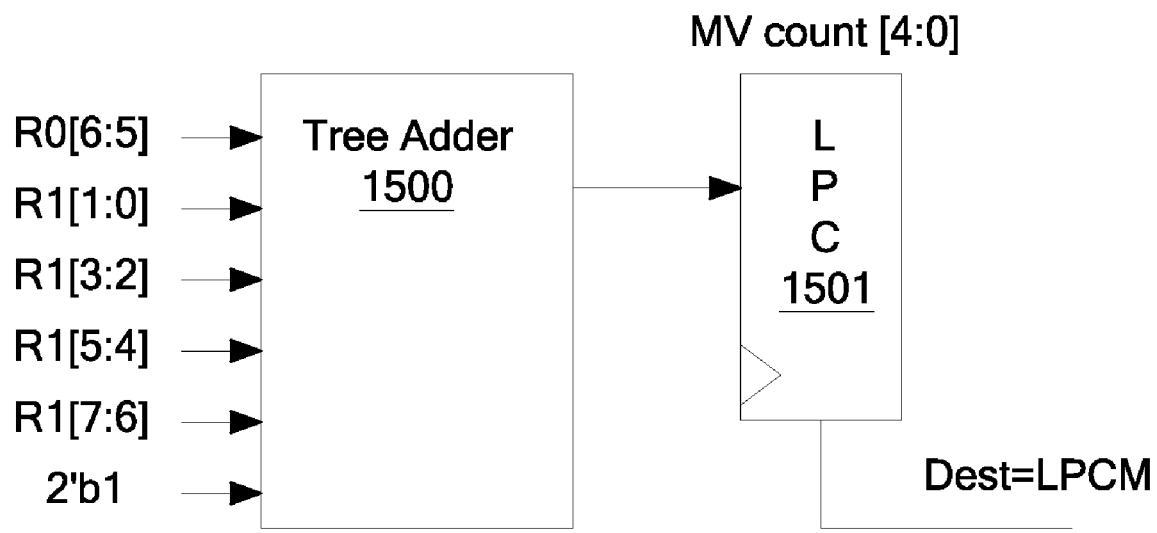
FIG. 15 illustrates one embodiment of motion vector count generator.

FIG. 14 illustrates one embodiment of macroblock and sub-macroblock partitions and FIG. 15 illustrates one embodiment of a MV count generator.

In one embodiment, a method is designed to generate the MV count based on two registers and adder tree. The motion count depends on the partition of the Macroblock and sub-macroblock. Each partition has its own Motion vector. A traditional method to derive the number of MV uses conditional decision or table lookup based on the Mbtype and subtype. To save cycle and hardware cost, an efficient method is designed to generate the MV count based on two general registers, R0, R1 and a dedicated small adder tree. The MV count is stored in loop counter LPC. The value of LPC is used for further decoding of delta MV. The LPCM means the Destination LPC is stored with MV counter.

In one embodiment, the MV decoding process in H.264 is as follows.

The execute engine decodes the MB type first. If the MB is inter, the execute engine decodes MB_TYPE which has four possible values (P_MB_16x8, P_MB_8x16, P_MB_8x8, P_MB_16x16). The decoded MB_TYPE is stored into R0[6:5]. The relationship between the block type and the value is shown in the following table.

TABLE 2

| | |
|---|---|
| P_MB_16x8 | 2 |
| P_MB_8x16 | 2 |
| P_MB_8x8 | 3 |
| P_MB_16x16 | 0 |

If the block type is P_MB_8x8, the execute engine decodes sub block type which has four possible values for each 8x8 block (SUBBLK_8x8, SUBBLK_4x8, SUBBLK_4x4, SUBBLK_4x4). The decoded sub_block_type of first 8x8 block is stored into R1[7:6]. The decoded sub_block_type of second 8x8 block is stored into R1[5:4]. The decoded sub_block_type of third 8x8 block is stored into R1[3:2]. The decoded sub_block_type of fourth 8x8 block is stored into R1[1:0]. The relationship between the sub_block_type and the value is shown in the following table.

TABLE 3

| | |
|---|---|
| SUBBLK_8x8 | 0 |
| SUBBLK_8x4 | 1 |
| SUBBLK_4x8 | 1 |
| SUBBLK_4x4 | 3 |

The execute engine generates the MV count and stores into LPC, by adding R0[7:5], R1[7:6], R1[5:4], R1[3:2], R1[1:0] and 1. The MV count is stored into the loop counter LPC; and the execute engine decodes the MV syntax elements by N times (if the N is equal to the MV count).

For example, the MB_TYPE=P_MB_8x8, the values of four 8x8 blocks are SUBBLK_8x4, SUBBLK_8x4, SUBBLK_8x4, SUBBLK_8x8. The value in the R0 and R1 will be 0x2a and 0x60 respectively. The total MV count is (3+1+1+1+0+1)=7.

The structure of a 6-input small tree adder is used to derive the number of MV. Each input to the tree adder is 2-bits.

In one embodiment, in decoding MV, several long instructions are used. The method 0 is defined as 0x22222223. The method 1 is defined as 0x22222222. The method 0 and method 1 can also be other values.

```
(1) BS0    CC16 NXT D2 #vlx_h264_ht_4      // ue_pmbtype r0+cfifo */
(2) BS0    CC16 CMP D0 #0xe060             // compare r0[7:5] == 3 (P or zero) */
(3) BS0    CC17 JMP D7 #h264_lt_dec_8x8_b8mode    // */
(4) BS0    !CC17 JMP D7 #h264_lt_dec_mb_mv        // */
h264_lt_dec_8x8_b8mode:
(5) BS0    CC17 NXT D4 #vlx_h264_ht_9      // if (p8x8) ue_0 cfifo/r1 [8x8 mbmode] */
(6) BS0    CC17 NXT D4 #vlx_h264_ht_9      // if (p8x8) ue_0 cfifo/r1 [8x8 mbmode] */
(7) BS0    CC17 NXT D4 #vlx_h264_ht_9      // if (p8x8) ue_0 cfifo/r1 [8x8 mbmode] */
(8) BS0    CC17 NXT D4 #vlx_h264_ht_9      // if (p8x8) ue_0 cfifo/r1 [8x8 mbmode] */
h264_lt_dec_mb_mv:
(9) BS0    CC16 SET    D15 #0              // set LPC
(10) BS1   CC16 LPCL D1 #vlx_h264_ht_42    // getMV */
```

In (1) BS0 means lookup method 0, designed for syntax completeness. CC16 means always TRUE. D2 means the CFIFO and R0 as destination. #vlx_h264_ht_3 means the start address of the PMBTYPE short table. NXT will execute the same instruction and go to the next instruction after short table finishes execution. The relation between MBType and R0 is described in the following Table.

TABLE 4

| MBTYpe | R0[7:0] |
|---|---|
| 16x16 Inter | {3'h0, 5'h0} |
| 16x8 Inter | {3'h1, 5'h0} |
| 8x16 Inter | {3'h2, 5'h0} |
| 8x8 Inter | {3'h3, 5'h0} |
| 4x4 Intra | {3'h5, 5'h0} |

In (2) BS0 means lookup method 0, designed for syntax completeness. CMP is a comparison instruction. It performs the following operation: If (R0[7:0] & 0xe0==0x60), the comparison result is TRUE; Else comparison result is FALSE.

In (3) BS0 means lookup method 0, designed for syntax completeness. CC17 means the comparison result in last instruction (2) is true. D7 means the JUNK destination. The result is discarded. JMP means if the CC17 is true, goto #h264_lt_dec_8x8_b8mode, Else goto next instruction. #h264_lt_dec_8x8_b8mode is the first address to decode the 8x8 submode.

In (4) BS0 means lookup method 0, designed for syntax completeness. CC17 means the comparison result in last instruction (2) is true. ! means inverting the condition. D7 means the JUNK destination. The result is discarded. JMP means if the CC17 is false, goto #h264_lt_dec_mb_mv.

h264_lt_dec_mb_mv is the first address to decode the MV. If MBType is not 8×8 Inter, skip the decode 8×8 submode and decode MV immediately.

In (5) (6) (7) (8) BS1 means lookup method 0. It decodes the 8×8 mode for 4 8×8 blocks in the current MB. CC17 means the comparison result in last instruction (2) is true. D4 means the CFIFO and r1+as destination. #vlx_h264_ht_9 means the start address of the short table. In one embodiment, the writing to R1+contains two operations: a) R1=R1<<2; b) R1[1:0]=decoded value; Before R1 is written, R1 will be shifted left by 2 bits automatically.

TABLE 5

| 8x8 mode | R1[1:0] |
|---|---|
| SUBBLK_8x8 | 0 |
| SUBBLK_8x4 | 1 |
| SUBBLK_4x8 | 1 |
| SUBBLK_4x4 | 3 |

For example, if the 8×8 modes of the four 8×8 block are 2, 1, 3, 0 respectively. Then R1 is changed as follows:
After (5), R1={6'h0, 2'h2};
After (6), R1={4'h0,2'h2,2'h1};
After (7), R1={2'h0,2'h2,2'h1,2'h3};
After (8), R1={2'h2,2'h1,2'h3,2'h0};

In (9) BS0 means lookup method 0. CC16 means always true. C=16 (see, e.g., Appendix) D15 means the LPC special register loaded with MV counter. LPC is loaded with MV Count which is the output of the tree adder. #0 is designed for syntax completeness.

In (10) BS1 means lookup method 1. CC16 means always true. C=16 (see, e.g., Appendix) D1 means the CFIFO as destination. #vlx_h264_ht_42 means the start address of the short table. LPCL will execute the same instruction for number of times specified in LPC.

Example. PMBType=3 (means 8×8 mode), the 8×8 modes of the four 8×8 block are 2, 1, 3, 0 respectively. After (8), R0={3'h3, 5'h0}, R1={2'h2,2'h1,2'h3,2'h0}. After (9), LPC=R0[7:5]+R1[7:6]+R1[5:4]+R1[3:2]+R1[1:0]+1=3+2+1+3+0+1=10. There are 10 Motion vectors in the current MB. After (10), the 10 MVs are decoded and stored into CFIFO.

Figure 16:
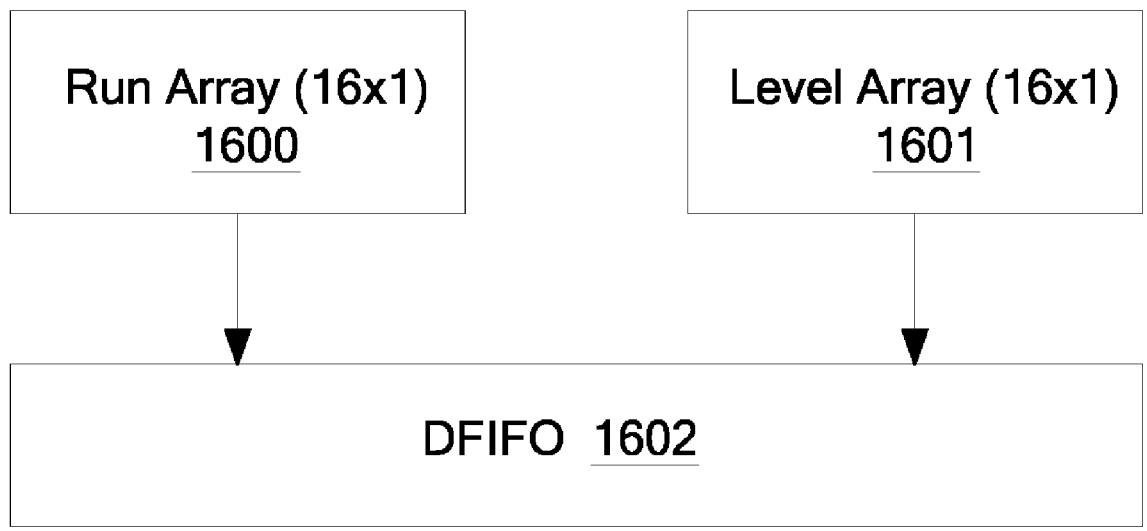
FIG. 16 illustrates one embodiment of a dual register structure for RUN and LEV transform coefficients.

FIG. 16 illustrates one embodiment of dual register structure for RUN and LEV transform coefficients.

In one embodiment, a dual register array structure is designed to store the transform coefficients (including run and level) symbols separately.

In H.264, the coefficients are decoded in run and levels separately, while in MPEG2, the coefficients are decoded as run and level pair at the same time. In order to support H.264 CAVLC decoding efficiently, two local 16×1 register arrays used to store run and level values are designed. The register array can be addressed in incremental order or in decremental order. The register array is designed to buffer the whole 16×1 block before the results are written to the DFIFO. After all 16 or less (depending on how many run level pairs in the current 4×4 block) run and level values are decoded, they are combined together as run level pair and pushed into the DFIFO. In case of MPEG2, the Run and Level arrays are bypassed and the run level pairs are stored into DFIFO directly. 16×1 register array can hold the maximum 16 coefficients of a 4×4 sub-block. In case of sub-block which has fewer coefficients, only the entries with lower address are filled. The register array is written in reverse order, address starts from i.e. N−1, down to 0. Here N means the number of coefficients in the current sub-block. The register array is read in the increased order, from 0 to N−1. The sign is stored in the MSB of level values.

Figure 17:
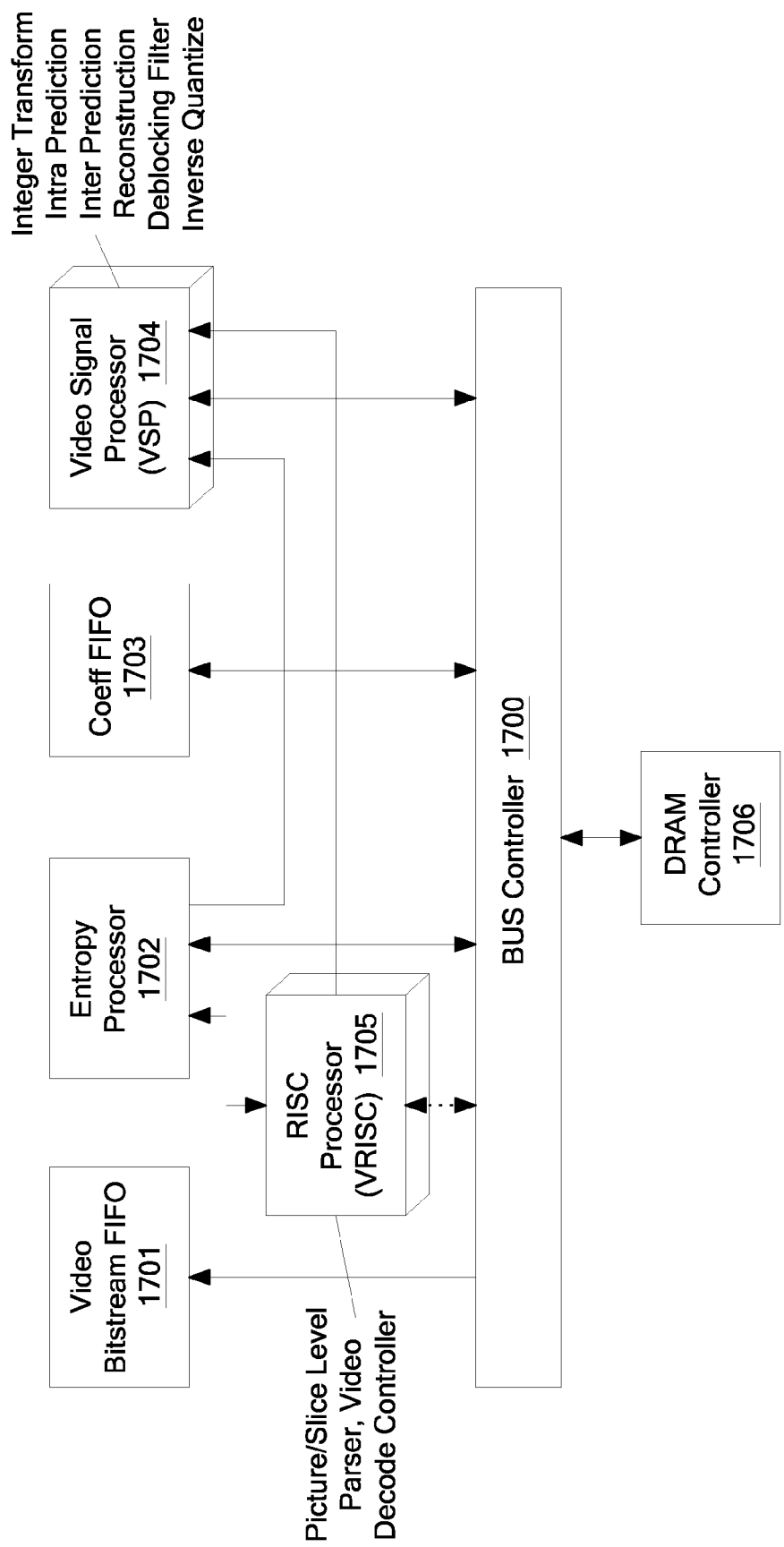
FIG. 17 illustrates one embodiment of video decoder system.

FIG. 17 illustrates one embodiment of video decoder system.

The video decoder system includes an entropy processor 1702, a video bitstream FIFO 1701, a video bitstream FIFO 1704, and coefficient (Coeff) FIFO 1703, a RISC processor 1705, a bus controller 1700 and a dynamic random access memory (DRAM) controller 1706. A RISC processor 1705 is used to decode picture and slice level variable length code (VLC) code or fixed length code through the bus controller 1700. The RISC processor 1705 is also used to download different opcodes and data into the table memory of the entropy processor 1702 to allow the entropy processor 1702 to decode VLC according to different video standards. Some video standards include H.264, MPEG2, MPEG4, VC1, H.263, and JPEG.

The entropy processor 1702 stores the VLC tables and handles the macroblock level bitstream parsing and decoding tasks. The entropy processor sends out the transform coefficient values to Video Signal Processor (VSP) for further decoding through Coefficient FIFO (CoeffFIFO). The Video Signal Processor (VSP) is used to process the inverse transform, intra prediction, inter prediction, and the deblocking filter tasks. There is a data path from the SFIFO of Entropy Processor and Video Signal Processor.

In one embodiment, the Special FIFO stores the Direct Memory Access (DMA) setting derived from the Motion Vectors. The SFIFO stores the special DMA parameters for Video Signal Processor.

The Entropy Processor handles VLC decoding for different video coding standards. In case of multiple bitstream input (e.g., one bitstream is MPEG2, another is H.264), the table memory can store multiple sets of VLC tables so that there is no need for RISC processor to switch tables during switch different bitstream decoding.

In one embodiment, multiple FIFOs, such as the SFIFO, the CFIFO, and the DFIFO can be read or written in parallel, so there is a high data transfer bandwidth between entropy processor and the other portions of the decoding system, such as a video signal processor (VSP) and CPU (see, e.g., FIG. 14). Entropy Processor, VSP and CPU can be integrated into a single chip or implemented in separate chip. For example, a CPU (VRISC) can read the data from the CFIFO and store the data into local memory for further processing. For example, MBType is read from CFIFO; and the external CPU can provide different commands to the external Video Signal Processor (VSP) based on Intra or Inter MBType. For example, an engine, such as the Video Signal Processor (VSP) or the external CPU, can read the data from the SFIFO to generate the Direct Memory Access (DMA) setting parameters. The external VSP also reads the Intra Predict Mode from the SFIFO and does the intra prediction process based on the Intra Predict Mode. Further details on the intra prediction process can be found in H.264 standard [1], which is incorporated herein by reference. The external Video Signal Processor can read the transform domain coefficients from DFIFO for further post processing, such as inverse quantization, inverse Transform (see, e.g., [1]). The three FIFOs are designed to be read or written in parallel to enable a very high data transfer bandwidth between Entropy Processor and the other portions of a decoding system, such as the VSP and/or the external CPU.

Figure 18:
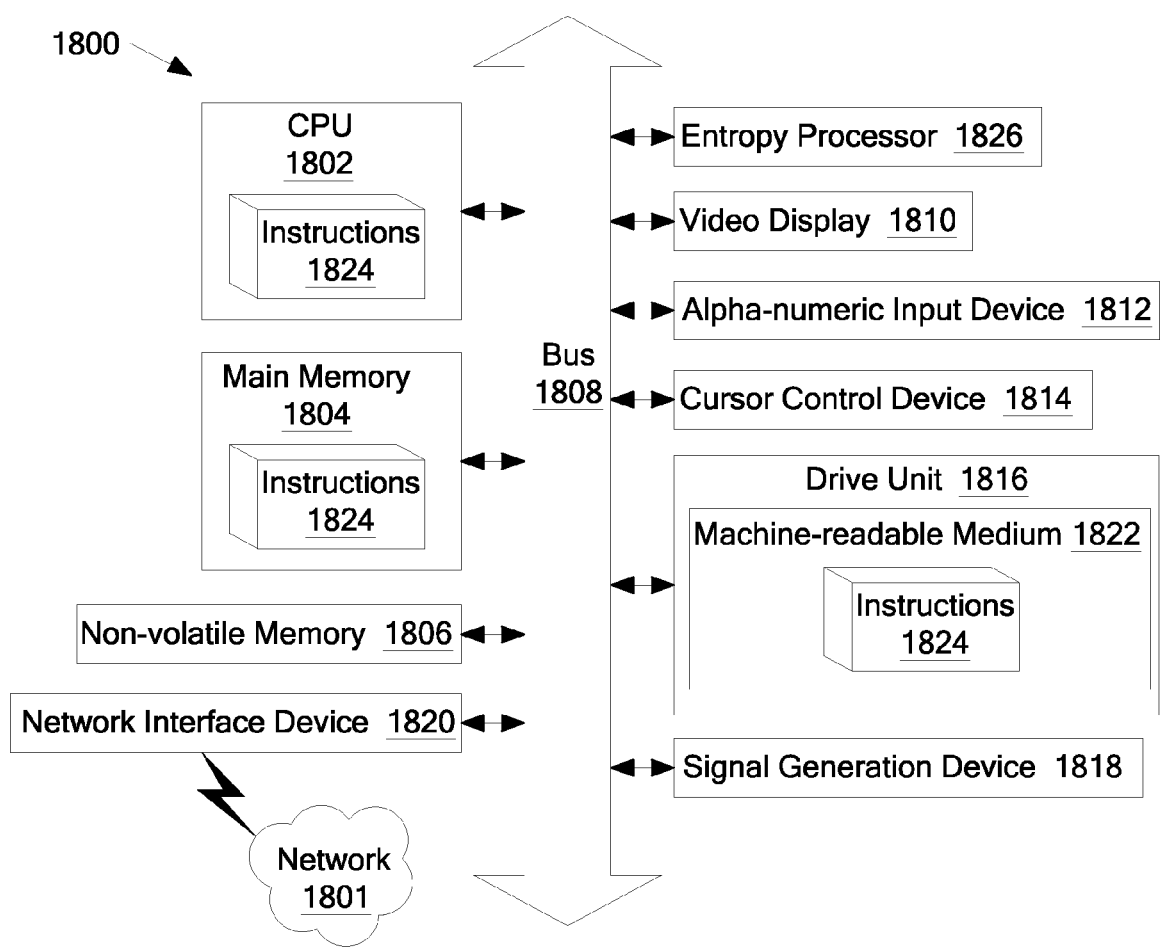
FIG. 18 shows a diagrammatic representation of a machine in the exemplary form of a computer system.

FIG. 18 shows a diagrammatic representation of a machine in the exemplary form of a computer system 1800 within which a set of instructions, for causing the machine to perform any one or more of the methodologies discussed herein, may be executed. The machine may be connected (e.g., networked) to other machines. In a networked deployment, the machine may operate in the capacity of a server or a client machine in a client-server network environment, or as a peer machine in a peer-to-peer (or distributed) network environment. In one embodiment, the machine communicates with the server to facilitate operations of the server and/or to access the operations of the server.

The computer system 1800 includes a central processing unit (CPU) 1802 (i.e., in some embodiments including a graphics processing unit (GPU), an entropy processor 1826, a main memory 1804 and a nonvolatile memory 1806, which communicate with each other via a bus 1808. In some embodiments, the computer system 1800 may be a laptop computer, personal digital assistant (PDA) or mobile phone, for example. The computer system 1800 may further include a video display 1810 (e.g., a liquid crystal display (LCD) or a cathode ray tube (CRT)). The computer system 1800 also includes an alphanumeric input device 1812 (e.g., a keyboard), a cursor control device 1814 (e.g., a mouse), a disk drive unit 1816, a signal generation device 1818 (e.g., a speaker) and a network interface device 1820. In one embodiment, the video display 1810 includes a touch sensitive screen for user input. In one embodiment, the touch sensitive screen is used instead of a keyboard and mouse. The disk drive unit 1816 includes a machine-readable medium 1822 on which is stored one or more sets of instructions (e.g., software 1824) embodying any one or more of the methodologies or functions described herein. The software 1824 may also reside, completely or at least partially, within the main memory 1804, the entropy processor 1826 and/or within the CPU 1802 during execution thereof by the computer system 1800, the main memory 1804 and the processor 1802 also constituting machine-readable media. The software 1824 may further be transmitted or received over a network 1801 via the network interface device 1820.

While the machine-readable medium 1822 is shown in an exemplary embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution. Examples of computer-readable media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Although embodiments have been described with reference to specific exemplary embodiments, it will be evident that the various modification and changes can be made to these embodiments. Accordingly, the specification and drawings are to be regarded in an illustrative sense rather than in a restrictive sense. The foregoing specification provides a description with reference to specific exemplary embodiments. It will be evident that various modifications may be made thereto without departing from the broader spirit and scope as set forth in the following claims. The specification and drawings are, accordingly, to be regarded in an illustrative sense rather than a restrictive sense.

APPENDIX

SHORT TEMPLATE
sssooooodddddddd
o: opcode field
d: immediate field, 8-b
s: shift field
s = 0-7, shift 0-7 bits
o = 0-31
The short instruction consists of 3 fields as follows.
Shf | op | #imm
LONG TEMPLATE
octtbbbbooooccc ntttddddddddddddd
b: breg select (BSEL)
o: opcode
c: condition
n: invert
t: dest
d: immediate data, 12-b
x: reserved
The long instruction consists of 5 fields as follows.
breg | cond | opcode | dest | #immed
SHORT INSTRUCTION SET
0 adv
    flushbits(s), pc = pc+d[7:0]+showbits(B[stage++]);
1 ld0 #d A
    A=#d, flushbits(s), stage = 0, return;
2 ld1 #d A
    A=#d+0x100, flushbits(s), stage = 0, return;
3 ldt0 #d A
    {R,A}=LUT0[#d], flushbits(s), S = getbits(1), stage = 0, return;
4 ldt1 #d A
    {R,A}=LUT1[#d], flushbits(s), S = getbits(1), stage = 0, return;
5 ldt2 #d A
    {R,A}=LUT2[#d], flushbits(s), S = getbits(1), stage = 0, return;
6 ldt3 #d A
    {R,A}=LUT3[#d], flushbits(s), S = getbits(1), stage = 0, return;
7 ldt4 #d A
    {R,A}=LUT4[#d], flushbits(s), S = getbits(1), stage = 0, return;
LUT0[A]: (A[7:2]<<12) | A[1:0]
LUT1[A]: (A[7:3]<<12) | A[2:0]
LUT2[A]: (A[7:4]<<12) | A[3:0]
LUT3[A]: (A[7:5]<<12) | A[4:0]
LUT4[A]: (A[7:6]<<12) | A[5:0]
LONG INSTRUCTION SET
1 NXT
B = B_array[#b];
if [!] #c {
    set #t D;
    cns #d; // call and switch
}
else
    pc=pc+2;
3 jmp APPENDIX-continued

```
if [!] #c {
    pc = #d; // jump
}
else
    pc=pc+2;
4 set dest
if [!] #c {
    dest = #d;
}
pc = pc+2;
7 LPCL
B = B_array[#b];
if [!] #c {
    if L pc = pc+2;
    else {
LPC--;
}
}
else
    pc = pc + 2;
8 CMP
    compare (R0 & {n,t[2:0],d[11:8]} and d[7:0].
    Registers
    General purpose registers
    R0: general register 0
    R1: general register 1
    Loop counter registers
    LPC: Loop counter.
    FIELD DEFINITION
    "t" field definition
0: dfifo
1: cfifo
2: cfifo,r0
3: cfifo,r1
4: cfifo,r1+
    r1<<=2.
5: lpc
    set lpc with immediate[7:0].
7: JUNK, results are not stored in anywhere.
15: LPCM
    set lpc with MV count.
    lpc=((r0+r1[1:0]+r1[3:2]+r1[5:4]+r1[7:6]+1)<<1).
16: r0
    r0=immediate[7:0]
17: r1
    r1=immediate[7:0]
"c" field definition
7-0: r0[7:0]
15-8:r1[7:0]
16: always
17: comparison result of CMP is TRUE
18: val==0
    Loop Condition definition
    L: LPC = 0
```

What is claimed is:

1. A method for processing a variable length code, the method comprising:
    determining a first address;
    executing a plurality of opcodes from at least one table starting at the first address;
    in response to each of the plurality of opcodes:
        receiving a portion of a sequence of bits, the sequence of bits comprising a first variable length code;
        receiving a first parameter from the at least one table at a current address, where the first parameter represents an integer;
        flushing a number of bits specified by the first parameter in the sequence of bits;
        receiving a second parameter corresponding to one of a plurality of stages, where the second parameter represents an integer;
        determining a value of a number of bits specified by the second parameter in the sequence of bits;
        receiving a third parameter from the at least one table at the current address;
        computing a next address, the next address being a sum of the current address, the third parameter, and the value of the number of bits specified by the second parameter; and
        retrieving a next opcode of the plurality of opcodes, the next opcode being retrieved from the next address; and
    determining a decoded syntax element corresponding to the first variable length code.

2. The method of claim 1, further comprising:
    selecting one of a plurality of lookup methods to determine a value of the second parameter for each of the plurality of stages.

3. The method of claim 1, further comprising:
    receiving a counter, wherein the executing of opcodes is performed a plurality of times corresponding to the counter.

4. The method of claim 1, further comprising:
    receiving a fourth parameter from the at least one table; and
    storing the decoded syntax element in a memory selected based on the fourth parameter.

5. The method of claim 4, wherein the memory is a register file.

6. The method of claim 4, wherein the memory is one of a plurality of FIFOs (First In First Out), the method further comprising selecting one of the plurality of FIFOs based on the fourth parameter.

7. The method of claim 1, wherein the determining of the decoded syntax element comprises:
    receiving a second opcode;
    in response to the second opcode:
        receiving a portion of the sequence of bits;
        flushing a number of bits specified by the first parameter in the sequence of bits; and
        storing the third parameter in a memory, to represent the decoded syntax element.

8. The method of claim 1, wherein the determining of the decoded syntax element comprises:
    receiving a second opcode;
    in response to the second opcode:
        flushing a number of bits specified by the first parameter in the sequence of bits;
        accessing the third parameter;
        determining a run from a first portion of D;
        determining a level from a second portion of D;
        accessing one bit in the sequence of bits to determine a sign; and
        storing the run, level and sign as the decoded syntax element in a memory.

9. The method of claim 1, further comprising:
    modifying contents of the at least one table; and
    decoding a portion of a second plurality of bits using the at least one table, the second plurality of bits comprising a second variable length code, the first variable length code and the second variable length code being encoded according to different standards.

10. The method of claim 1, wherein the first variable length code is encoded according to one of a plurality of encoding standards consisting of H.264, MPEG2, MPEG4, VC1, H.263, and JPEG.

11. The method of claim 1, wherein the flushing of the number of bits specified by the first parameter in the sequence of bits and the determining of the value of the number of bits specified by the second parameter in the sequence of bits comprise:

left shifting the portion of the sequence of bits according to the first parameter; and right shifting the portion of the sequence of bits to determine the value of the number of bits specified by the second parameter in the sequence of bits.

12. A processor comprising:

at least one table having a plurality of opcodes, the at least one table being configured to receive a current address and generate a first parameter and a second parameter for each of a plurality of decode stages;

a bit aligner configured to receive a portion of a sequence of bits, receive the first parameter and the second parameter from the at least one table, flush a number of bits specified by the first parameter from the sequence of bits and extract a number of bits specified by the second parameter from the sequence of bits, the sequence of bits comprising a first variable length code;

an address generator configured to access a third parameter from the at least one table at the current address and compute a next address for each of the plurality of decode stages, the next address being a sum of the current address, the third parameter, and the value of the number of bits specified by the second parameter in the sequence of bits; and an execution engine configured to execute the plurality of opcodes in the at least one table and determine a decoded syntax element corresponding to the first variable length code.

13. The processor of claim 12, wherein the at least one table comprises:

a first table configured to receive a first table address and generate a second table address from the first table address; and a second table configured to receive the second table address and generate from the second table address a plurality of values of the second parameter each corresponding to one of a plurality of decode stages; and wherein the processor further comprises:

a counter configured to generate a stage count; and a multiplexor coupled to receive the stage count to select one of the plurality of values for the second parameter corresponding to the stage count.

14. The processor of claim 12, further comprising a counter, wherein the execution engine is configured to execute opcodes a number of times starting at a first address according to the counter.

15. The processor of claim 12, further comprising a plurality of registers, wherein a fourth parameter is received from the at least one table, the execution unit being further configured to store the decoded syntax element in a register selected based on the fourth parameter.

16. The processor of claim 12, further comprising a plurality of FIFOs (First In First Out), wherein a fourth parameter is received from the at least one table, the execution unit being further configured to store the decoded syntax element in a FIFO selected based on the fourth parameter.

17. The processor of claim 12, wherein the execution unit is further configured to store the decoded syntax element in a memory, the decoded syntax element being assembled from at least one value of the third parameter from the at least one table.

18. A machine-readable storage medium embodying instructions, the instructions causing a processor to perform a method to process a variable length code in a sequence of bits, the method comprising:

executing a plurality of opcodes including an opcode at a first address, comprising, in response to the opcode at the first address:

receiving a first parameter, a second parameter and a third parameter corresponding to the opcode;

flushing a number of bits from the sequence of bits according to the first parameter;

computing a second address based on summing the first address, a number of bits in the bit stream specified by the second parameter, and the third parameter; and retrieving an opcode based on the computed second address; and determining a decoded syntax element corresponding to the variable length code.

19. The machine-readable storage medium of claim 18, wherein the plurality of opcodes, the first parameter, and the third parameter are stored in a first table; and the second parameter is stored in a second table.

20. The machine-readable storage medium of claim 18, further comprising:

storing the decoded syntax element in a memory selected according to a fourth parameter, wherein the plurality of opcodes, the first parameter, and the third parameter are stored in a first table, and the fourth parameter is stored in a second table.

* * * * *